(12) United States Patent
Ito et al.

(10) Patent No.: US 7,240,317 B2
(45) Date of Patent: Jul. 3, 2007

(54) PLACEMENT/NET WIRING PROCESSING SYSTEM

(75) Inventors: Noriyuki Ito, Kawasaki (JP); Ryoichi Yamashita, Kawasaki (JP); Keiko Osawa, Kawasaki (JP); Tomoyuki Isomura, Kawasaki (JP); Hiroaki Hanamitsu, Campbell, CA (US); Hideaki Katagiri, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 138 days.

(21) Appl. No.: 10/625,554

(22) Filed: Jul. 24, 2003

(65) Prior Publication Data

US 2004/0148582 A1  Jul. 29, 2004

Related U.S. Application Data

(62) Division of application No. 09/811,772, filed on Mar. 20, 2001, now Pat. No. 6,629,305.

(30) Foreign Application Priority Data

Oct. 3, 2000  (JP) .............................. 2000-304083

(51) Int. Cl.
    *G06F 17/50* (2006.01)
(52) U.S. Cl. .................... 716/11; 716/8; 716/9; 716/10
(58) Field of Classification Search .................. 716/11, 716/8, 9, 10
    See application file for complete search history.

(56) References Cited

U.S. PATENT DOCUMENTS

| 5,050,091 A | * | 9/1991 | Rubin .......................... 716/10 |
| 5,247,455 A | * | 9/1993 | Yoshikawa .................... 716/15 |
| 5,847,968 A | * | 12/1998 | Miura et al. .................... 716/8 |
| 6,035,111 A | | 3/2000 | Suzuki et al. ................. 716/11 |
| 6,240,541 B1 | | 5/2001 | Yasauda et al. ................ 716/6 |
| 6,260,177 B1 | | 7/2001 | Lee et al. ...................... 716/2 |
| 6,298,468 B1 | | 10/2001 | Zhen ............................. 716/2 |

FOREIGN PATENT DOCUMENTS

| JP | 04-277870 | 10/1992 |
| JP | 07-306886 | 11/1995 |
| JP | 08-227428 | 9/1996 |
| JP | 08-278998 | 10/1996 |
| JP | 09-128437 | 5/1997 |
| JP | 09-223164 | 8/1997 |
| JP | 09-022423 | 1/1999 |
| JP | 11-134374 | 5/1999 |
| JP | 11-161688 | 6/1999 |

OTHER PUBLICATIONS

Japanese Office Action mailed Dec. 19, 2006 in corresponding Japanese Patent Application No. 2000-304083.

* cited by examiner

*Primary Examiner*—Sun James Lin
(74) *Attorney, Agent, or Firm*—Staas & Halsey LLP

(57) ABSTRACT

A placement/net wiring processing system uses an interactive editor which eases and simplifies operations for placing or moving cells and adding, deleting or modifying wiring. The placement/net wiring processing system comprises a control means for controlling the execution of a placement and wiring operating and processing program, a display means for displaying placement and wiring information on a screen, an operating and processing means for operating the placement and wiring on the screen, and an information management means for managing the placement and wiring information. The control means copies the program read out thereby and afterwards executes the program. The display means displays the contents of the placement and wiring graphic information on the screen in accordance with the selection and relates processing-related information associates with placements and wiring which are read out of a storage division and designated by user to the placement and wiring graphic information for display on a screen.

14 Claims, 17 Drawing Sheets

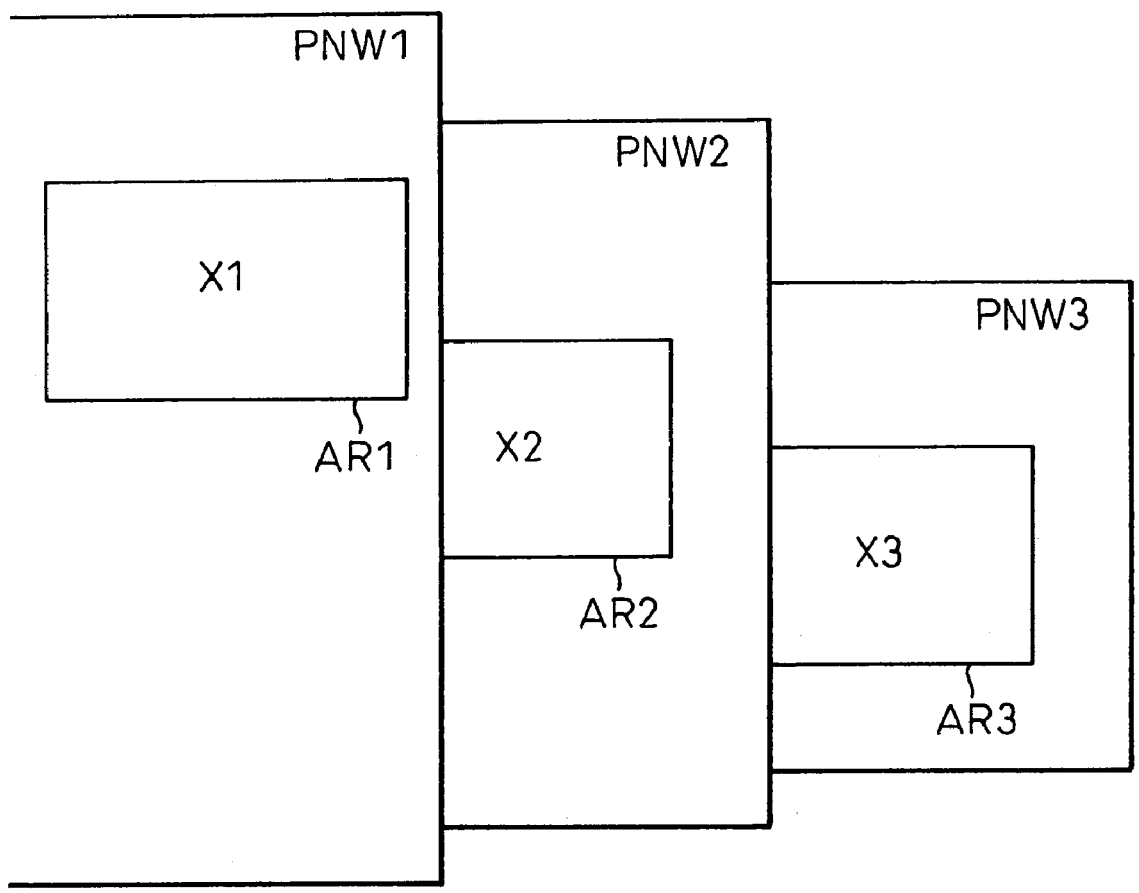

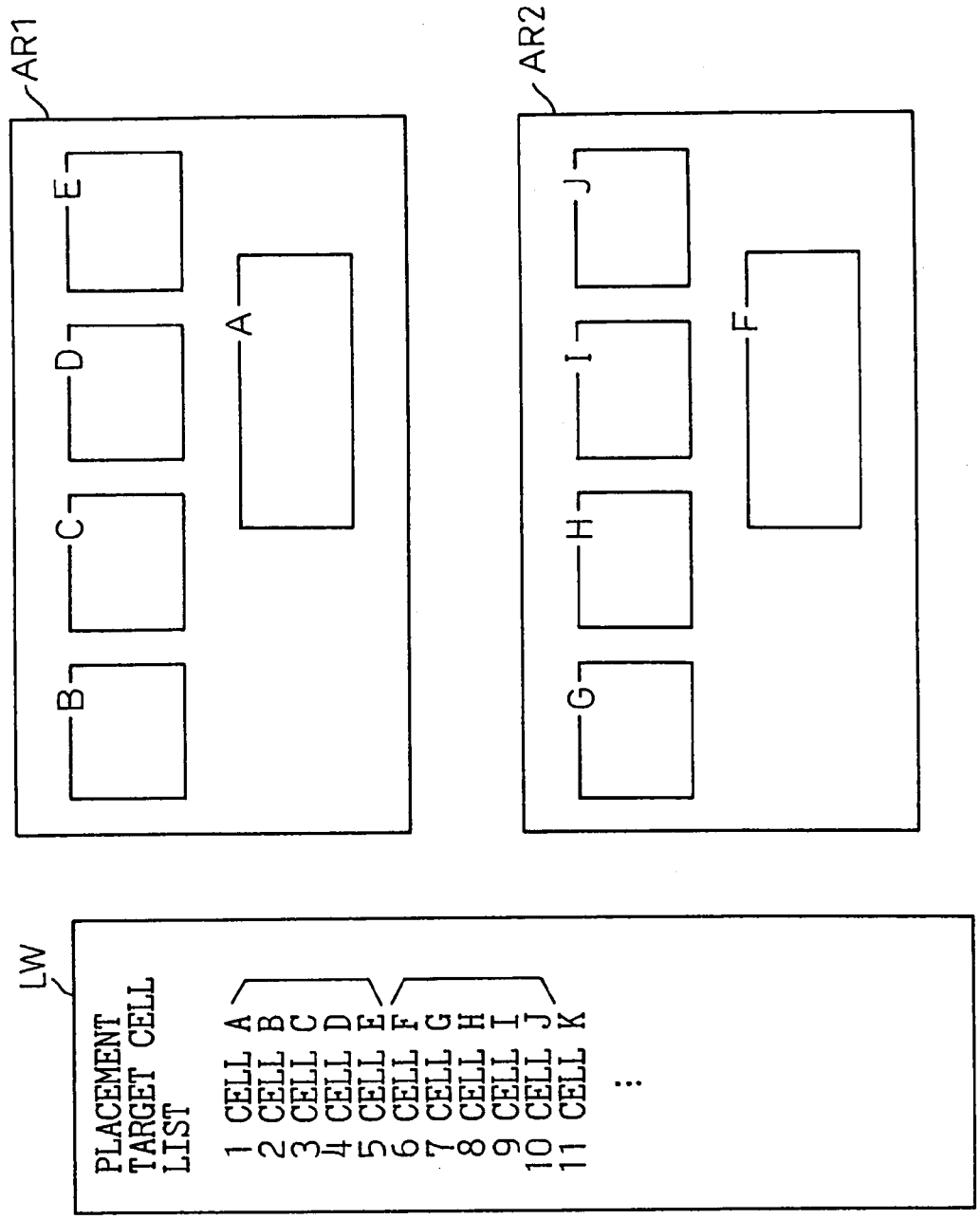

Fig.15A
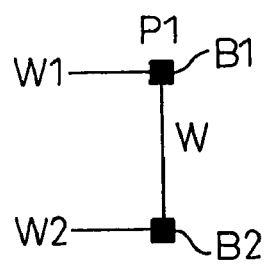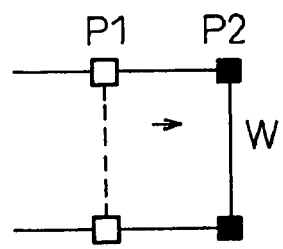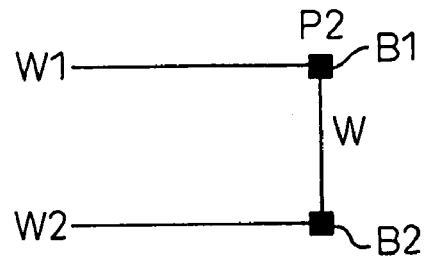
Fig.15B
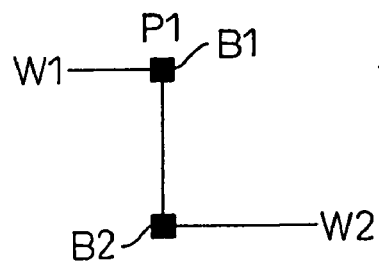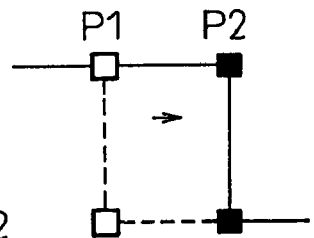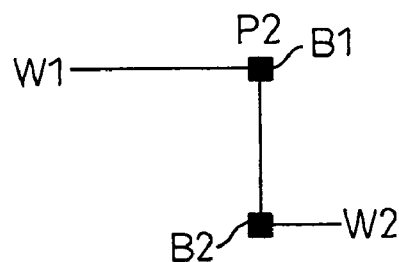
Fig.15C
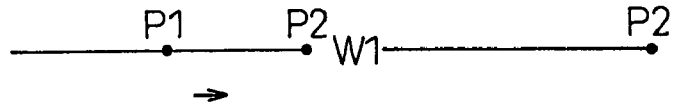
Fig.15D
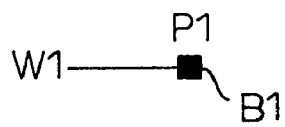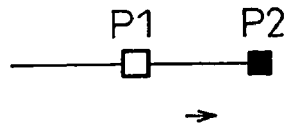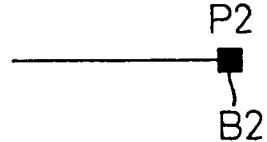

PLACEMENT/NET WIRING PROCESSING SYSTEM

This application is a Divisional of application Ser. No. 09/811,772, filed Mar. 20, 2001, now U.S. Pat. No. 6,629,305.

BACKGROUND OF THE INVENTION

1. Field of the Invention

The present invention relates to a placement/net wiring processing system, and more particularly to a placement/net wiring processing system in which operations for processing of placement and net wiring are eased and simplified in an editor for processing placement and net wiring on an editor screen in an interactive fashion.

2. Description of the Related Art

In recent years, as in the case of CAD, computers have been in extensive use for designing products or the like.

For example, in designing LSIs, PCBs or the like, several millions of elements are integrated in a chip, and those elements are connected to each other through a network. The level of this type of work is far beyond the ability of human beings if they try to do such work manually. Then, to cope with such work, automation using computers has become essential in designing LSIs and PCBs.

With such automated designing, since an LSI can be automatically designed from its logic design through packaging design and diagnosis, the automated designing is significant as a tool for supporting the layout design of the LSI at a high degree in developing a large-scale and high-performance LSI within a short period of time.

To cope with this, there already exist a number of editors with which a man or woman can process the placement or net wiring in an LSI in an interactive fashion on the screens of the editors when he or she tries to design the placement in the LSI.

While there have already existed a number of editors with which a man or woman can process the placement or net wiring in an LSI, PCB and the like in an interactive fashion, most of them are intended for automatic placement and fine adjustments after net wiring is completed, and therefore work such as placing or moving cells and adding, deleting or modifying the net wiring can not be carried out with ease when a data has lots of cells and net wiring. To cope with this, a function of assisting such work is required.

In addition, for users who develop LSIs, PCBs or the like, in a case where they develop large-scale LSIs, PCBs or the like, a number of operators are assigned to concurrently design placements of blocks resulting after a chip is divided. In addition to that, the number of kinds of LSIs to be developed is enormous, and therefore program modifications, such as changes and updates are carried out frequently by the placement/net wiring processing program which is executed in an editor with a view to dealing with the enormous number of kinds of LSIs developed.

Due to this, with the aforesaid editor, when the program is modified at a server unit, the work of the operators is interrupted, thus decreasing the working efficiency. Furthermore, when the server unit fails, the work of many of the operators is interrupted, thus causing a problem.

In addition, the layout design of an LSI is carried out in such a manner as to sequentially proceed from the upstream towards the downstream in several processes. It is desirable to keep the consistency between the processes such that an output data from a certain process automatically becomes an input to the following process, so that re-entry of design data can be avoided.

Due to this, when certain work is processed by executing a plurality of programs sequentially, it is necessary to confirm that a series of operations is carried out properly without omission. As is disclosed in Japanese Unexamined Patent Publication (Kokai) No. 5-12037, there is proposed as a means for dealing with this a method for automatically carrying out a series of operations while determining which operation is to be continued, based on ending codes related to the operations.

However, with this method, since it is not possible to proceed to the following work before the ending code of the current work has been confirmed, as in the case with the layout design work of an LSI chip, it is not possible to proceed with execution of a program as it is for the time being even if some errors are detected in the course of the execution of the program. This causes a problem that the working efficiency of the operators is deteriorated.

Although errors themselves must be corrected, they do not have to actually be so done every time an error occurs provided that a series of operations is ensured to be carried out without omissions and errors in the end. To make this happen, it is necessary to carry out the management of the execution history of respective programs and work history of objects and events in an ensured fashion.

Additionally, in an editor for processing the placement/net wiring in an LSI, for example, in an interactive fashion or a general editor, in order for a series of operations to be carried out without omissions and errors in designing the layout of the LSI, it is imperative in layout design to ease placing or moving cells or adding, deleting or modifying net wiring for data involving a number of cells and an extensive net wiring to thereby improve the workability of operators.

Thus, an object of the present invention is to provide a placement/net wiring processing system with various operational functions so that operations for placing or moving a number of cells or adding, deleting or modifying the net wiring can be performed easily and simply when designing placements to thereby carry out a series of operations properly without omissions.

SUMMARY OF THE INVENTION

With a view to solving the aforesaid problem, according to an aspect of the present invention, there is provided a placement/net wiring processing system comprising at least a control means for controlling the execution of a program for operating and processing placements/net wiring, a display means for displaying on its screen information related to the placements/net wiring so processed, an operating and processing means for operating and processing the placements/net wiring on the screen of the display means, and an information management means for managing the information related to the placements/net wiring. Operations for placing or moving cells and adding, deleting or modifying the net wiring can be done by the system.

The control means copies the program so read out and thereafter executes the copied program, and the information management means stores execution history information of the placement/net wiring processing program once the program is executed.

The control means is also designed to check the placement/net wiring processing operated by the program based on the stored execution history information.

Additionally, according to another aspect of the present invention, a placement/net wiring processing system through an interactive editor comprising at least a control means for controlling the execution of a program for operating and processing placements/net wiring, a display means for displaying on an editor screen information related to the placements/net wiring, an operating and processing means for operating the placements/net wiring on the editor screen, and an information management means for managing the information related to the placements/net wiring.

The information control means can store modified information resulting when the placement/net wiring graphic information is operated to be modified on the editor screen, and the display means can display on the editor screen the modified information so stored. Furthermore, when the displayed placement/net wiring graphic information is sequentially selected and designated, the display means displays the contents associated with the placement/net wiring graphic information so selected and designated.

When the control means reads out processing-related information on the placement/net wiring which is stored in a storage unit and is designated by the user, the display means displays on the editor screen the read out information in association with the placement/net wiring graphic information.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 9 is a diagram showing a display example in which marked areas are displayed sequentially, FIG. 11 is a diagram showing a display example when a catalogue registration/placement is carried out on the editor screen, FIGS. 15A to 15D are diagrams showing respective specific examples when net wiring stretching is carried out.

DESCRIPTION OF THE PREFERRED EMBODIMENTS

Figure 1:
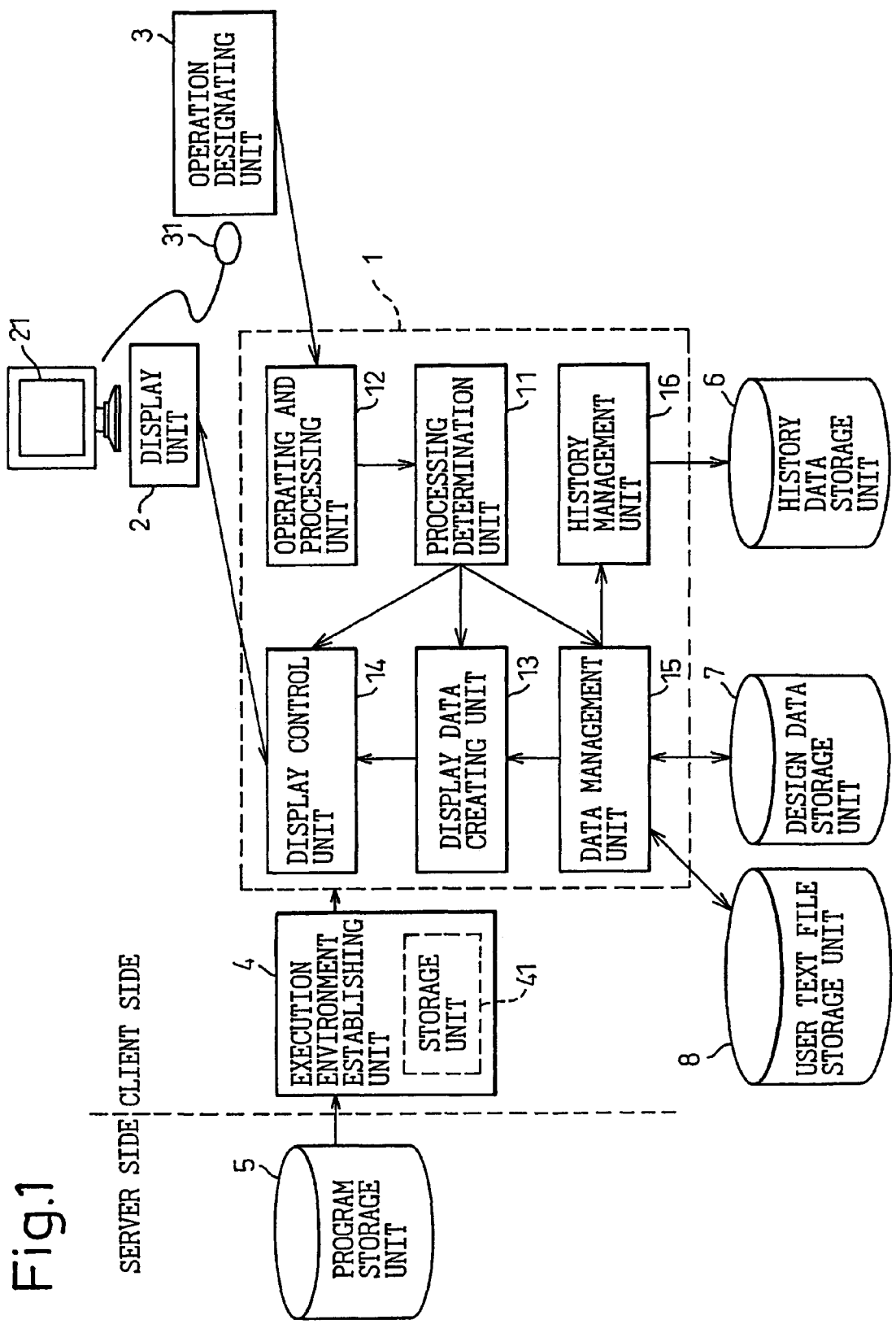
FIG. 1 is a diagram showing the schematic system configuration of an interactive placement/net wiring processing system.

Referring to the drawings, various embodiments of a placement/net wiring processing system according to the present invention will be described.

FIG. 1 shows a schematic system configuration according to the present invention for realizing a cell placement/net wiring processing in the layout design of an LSI, for example.

As shown in FIG. 1, the placement/net wiring processing system comprises a control unit 1, a display unit 2, an operation designation unit 3, an execution environment establishing unit 4 and a program storage unit 5. The display unit 2 has a monitor screen 21 of CRT or LCD and can display placement/net wiring windows or the like. In addition, the operation designation unit 3 has a mouse 31 and a pointer function in which a cursor is operated on the monitor screen via the mouse to point a designated window or the like. Additionally, on top of the mouse 31, the operation designation unit 3 has an input function via a keyboard.

The program storage unit 5 is disposed in a server unit and stores a program for executing placement/net wiring processing. The execution environment establishing unit 4 is intended to read out the program from the program storage unit 5 so that the control unit 1 can execute the placement/net wiring processing to thereby establish an execution environment in which the control unit can execute the program. A number of operators are allowed to execute placement/net wiring processing via interactive edits at respective client devices in accordance with the program.

The control unit 1 comprises a processing control unit 11, an operation processing unit 12, a display data creating unit 13, a display control unit 14, a data management unit 15 and a history management unit 16.

Designations from the operation designation unit 3 operated by the operator are inputs to the operation processing unit 12, and the display control unit 14 has layout information created at the display data creating unit 13 for placement/net wiring processing displayed on the display unit 2.

The data management unit 15 reads out layout information needed for placement/net wiring processing from a layout database, sends it to the display data creating unit 13 and stores design data, which is the result of placement/net wiring, in a design data storing unit 7.

In addition, in the event that the operator creates a his or her own unique check program separately from a check program which is installed in the placement/net wiring processing system, an external text file storage unit 8 is provided so as to deal with a case where a part of the layout database is converted into a text in relation to the unique program, and the data management unit 15 is designed to control the external text file storage unit 8.

Furthermore, the data management unit 15 sends out history data in relation to the history of respective operations in the course of the placement/net wiring processing to a history management unit 16. Then, the history management unit 16 stores the history data of the respective operations, a program execution history and the like in a history data storage unit 6 for management.

By configuring the placement/net wiring processing system as described above, the layout information following the designation by each operator sent from the operation designation unit 3 is displayed on the monitor screen 21 and the displayed layout information can be operated on the monitor screen 21, whereby the placement/net wiring processing system shown in FIG. 1 can be an interactive placement/net wiring editor.

Figure 2:
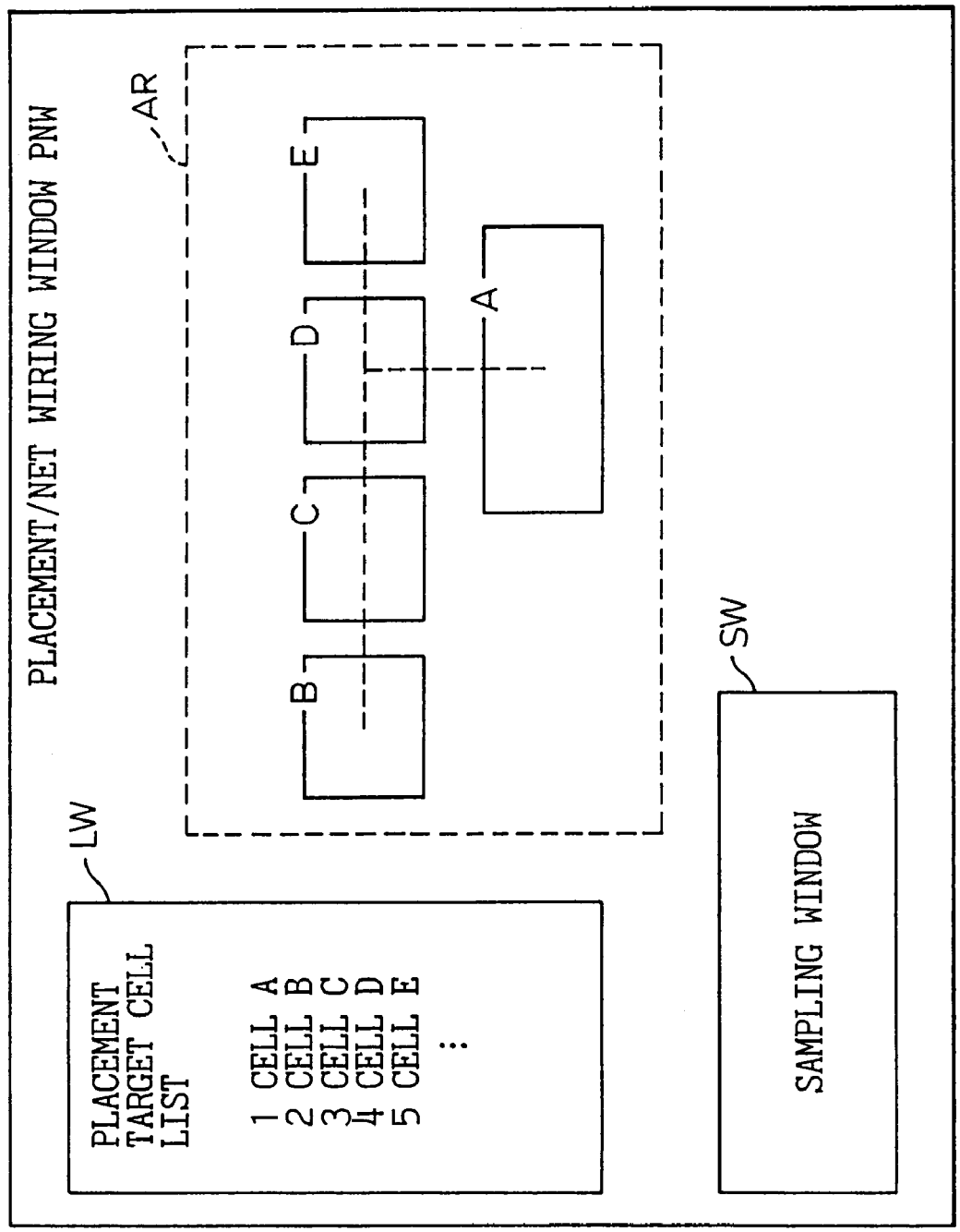
FIG. 2 is a diagram showing display examples of placement/net wiring windows.

Here, an operation screen example displayed on the monitor screen 21 of the placement/net wiring processing system which operates as the interactive placement/net wiring editor is shown in FIG. 2.

Shown in FIG. 2 is a placement/net wiring window PNW for performing a placement/net wiring processing operation for cells in the layout design of an LSI. FIG. 2 shows a case where cells A to E are placed and net wired in an area AR which is a layout object.

A list window LW and a sampling window SW are displayed in areas which do not overlap the area AR which is an object area where cells are placed and networked.

A menu for executing placement/net wiring processing and placement/net wiring objects are displayed in the list window LW, and the operator can execute a placement/net wiring processing displayed in the window PNW by manipulating, for example, the mouse 31 to move the cursor displayed on the screen 21 to an item displayed in the window LW and clicking on the item. In FIG. 2, since a cell layout example is shown, cell names specifying placement object cells are displayed in the list window LW.

In addition, in a case where a sampling mode is selected, the contents associated with information displayed at a position designated by the cursor manipulated by the operator via the mouse 31 are displayed in the sampling window SW. In the event that the operator moves the cursor with the mouse 31, information existing along the move path is displayed sequentially in the sampling window SW. For instance, in the event that the cursor is positioned within a frame representing the cell B, the contents of the cell B such as its position coordinate, characteristic, connecting relationship or the like are displayed. The contents of the cell B continue to be displayed as long as the cursor stays within the frame, but in the event that the cursor is moved to the next frame, the contents of a frame to which the cursor is moved are then displayed therein.

Figure 3:
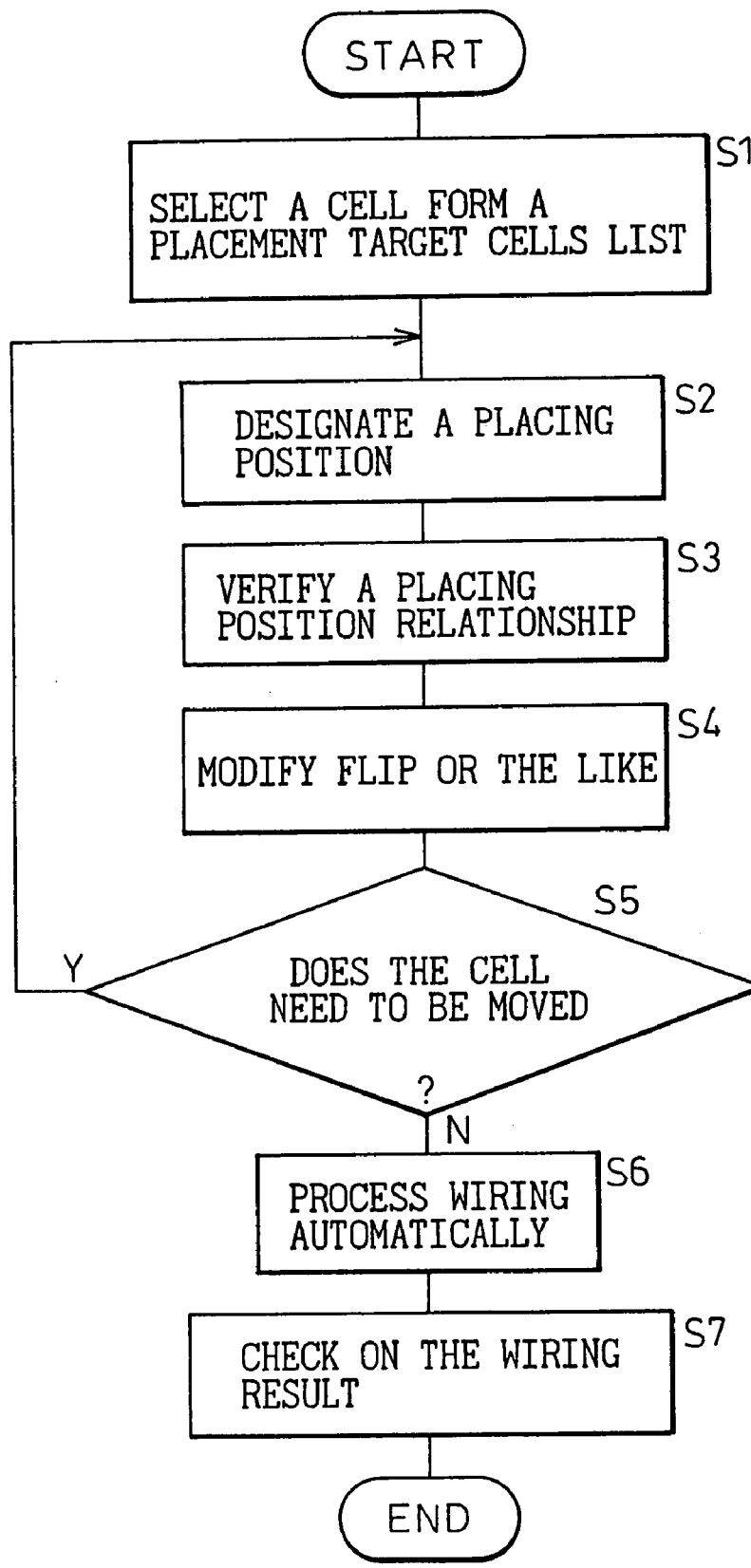
FIG. 3 is a flow chart showing a processing flow of performing an interactive placement/net wiring.

Then, a case where an interactive placement/net wiring processing is carried out on the placement/net wiring window PNW shown in FIG. 2 will be described with reference to a processing flow shown in FIG. 3.

First of all, when a block of an LSI is designated, the designated block is displayed in the window PNW from the layout database. An area in the block where cells have not yet been placed is highlighted. Then, when the cursor is moved to an area AR where no cell has been placed yet, as shown in FIG. 2, the area AR is enlarged for display in the PNW window.

When the area AR is displayed, required data on cells to be placed in the area AR is read out from the layout database, and names of object cells to be placed in the area AR are then displayed in the list window LW.

The operator moves the cursor and selects one of the cell names displaced in the list window LW (step S1).

The placement position of the selected cell, for example, a cell A, is designated by the cursor. As this occurs, with the sampling mode being activated, since information on the cell A is automatically displayed in the sampling window SW, this will help designate the position. Thus, the operator sequentially designates positions for the cell names displayed in the list window LW in the area AR in accordance with a layout design policy which is separately determined (step S2).

In designating the positions of the cells, the operator may move the cursor to the cell name in the list window LW so as to click on the cell name and thereafter move the cursor to the position in the area AR where the cell is to be placed. In addition, the operator may move the cursor onto the cell name in the list window LW using a paste function and move the cursor to the position in the area AR where the cell is to be placed while keeping the cell name clicked on, where the operator may click off the cell name for designation of the position thereof.

When the placement of the cells whose names are displayed in the list window LW is completed, for example, as to the positional relationship between the cells, as shown in FIG. 2, since centers of the respective cells are displayed by broken lines, the positional relationships of the respective cells are confirmed (step S3). For example, in the event that the cell A constitutes a driver division, it is seen that the cells B to E are driven by the cell A.

Here, a modification such as flipping is required for each cell displayed, a required modification is carried out for each cell (step S4).

In the event that the position of the cell needs to be moved in conjunction with the position confirmation carried out in step S3 and the modification carried out in step S4 (step S5), then return to step S2 to re-designate a position where the cell is to be placed (step S6).

Then, when an automatic net wiring processing is carried out among the cells, requirements which are predetermined, such as whether or not the respective networks are properly connected, whether or not there exists an overlapping of net wirings or the like, are checked to see if the results of the networking processing comply with the requirements (step S7). As to the check results, in the event that there is an error which does not comply with the requirement, an X mark is displayed at a relevant portion or the relevant portion is highlighted in a different color. The placement positions of the respective cells can be modified in accordance with these check results.

The history management unit 16 stores the aforesaid processing history and, moreover, data related to the check results in the history data storage unit 6. Then, the data management unit 15 stores the results of the completion of the placement/net wiring processing for each cell in the design data storage unit 7.

While the cell placement/net wiring processing system configured as described above has been described, next, various means for performing easily and simply work such as placing or moving cells or adding, deleting or modifying a net wiring for a data involving many cells and net wirings which constitute the LSI will be described for each embodiment, with reference to the accompanying drawings.

(First Embodiment)

In the cell placement/net wiring processing system shown in FIG. 1, the execution environment establishing unit 4 reads out from the program storage unit 5 a program to be executed and establishes at a client device an environment in which an interactive placement/net wiring editor can be executed on the screen 21 of the display unit 2.

In this system, since the client device is run by the program stored in the program storage unit 5 disposed in the server device, for example, in the event that there occurs a failure in the program, or that the function is modified or updated, the execution of the program at the client device is interrupted.

Due to this, in the first embodiment, even when the program is updated for modification at the client device during the execution of the program, the program is designed to operate properly in a state prior to the update at the client device.

A storage unit 41 is provided with the execution environment establishing unit 4 for storing a program stored in the program storage unit 5 in the server unit when the program is read out. A program stored in the program storage unit 5 is copied in the storage unit 41 once, and this copied program is applied to the environment of an individual who executes the program. Then, even when updating work such as a program modification is carried out at the server device while the program is being executed at the client device, the program prior to the update can be referred to from the storage unit 41 for execution.

In the event that a system requires a long period of time from the start to end of a program, or that program modifications occur frequently, there is caused no influence to the operator who has already started the program. On the other hand, at the client device, for an operator who is going to execute the program, the updated program is read out from the program storage unit 5 for application to the client device.

Figure 4:
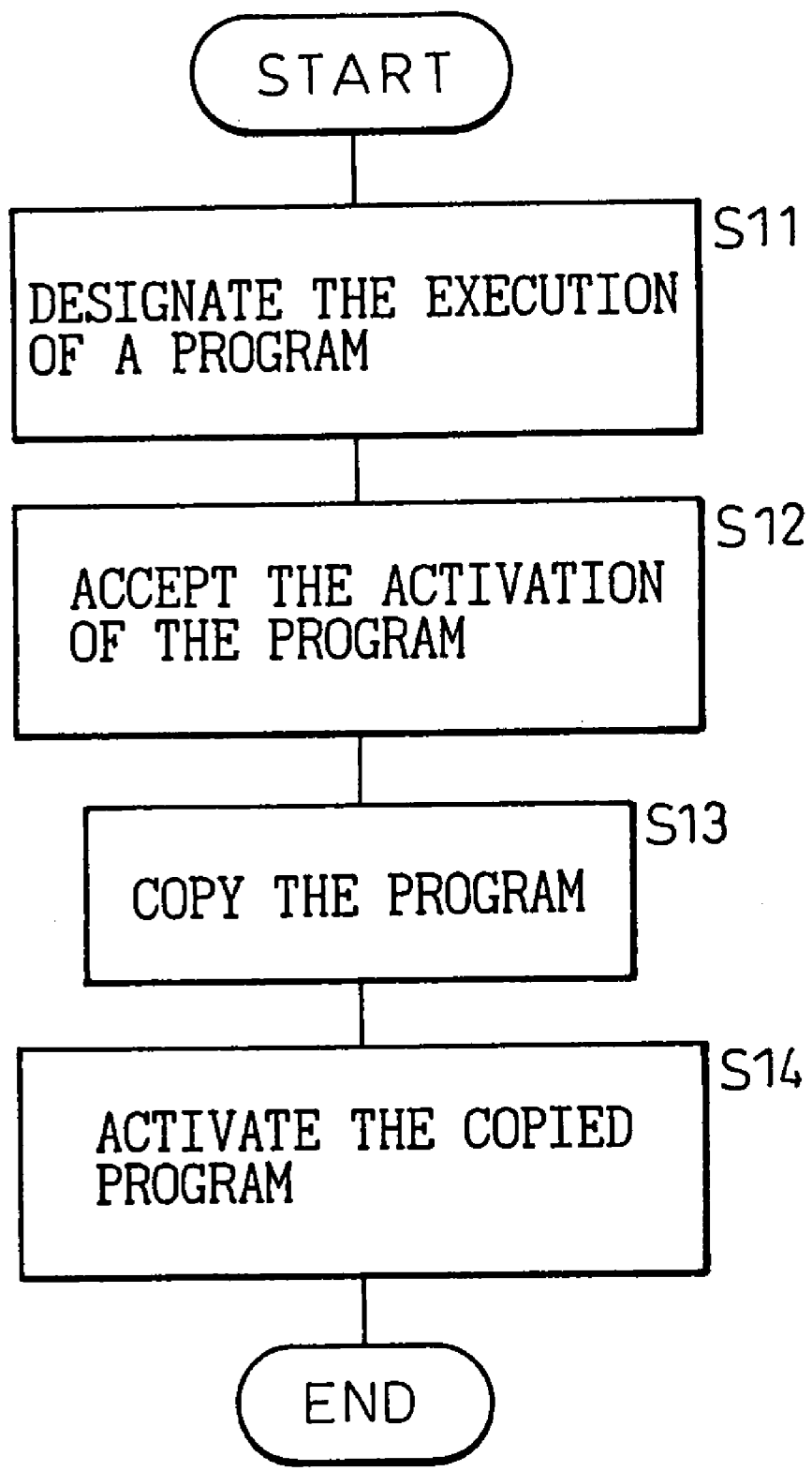
FIG. 4 is a flow chart showing a processing flow of establishing a program execution environment.

Next, a process in which the execution environment establishing unit 4 establishes an execution environment for the client device will be described with reference to a processing flow shown in FIG. 4.

First of all, when the operator manipulates the operation designation unit 3 to enter the start of the placement/net wiring processing system, the execution environment establishing unit 4 is directed to execute the program (step S11).

When accepting the program activation (step S12), the execution environment establishing unit 4 reads out the program stored in the program storage unit 5 so as to copy the same program in the storage unit 41 thereof (step S13).

The execution environment establishing unit 4 activates the copied program and establishes an execution environment for this program (step S14).

Thus, since the program to be executed is copied in the storage unit 41 and since the execution environment is established using the program so copied, even if the program stored on the server device is modified or updated during the execution of the program, there is caused no influence over the execution environment at the client device, and, when new work is initiated, since the modified and updated program is applied, the modification and updating of the program can be carried out in a smooth fashion.

(Second Embodiment)

In the placement/net wiring processing system shown in FIG. 1, the system is provided with the history data storage unit 6 for storing the processing history and history data associated with the check results.

However, for example, in the cell placement/net wiring processing in the layout design of an LSI, a plurality of programs are executed sequentially, and in the event that the work is not carried out properly, a proper placement/net wiring processing cannot be completed. With the history data only being stored in the history data storage unit 6, it is not possible to grasp whether or not the work has been carried out properly.

In addition, in the event that certain work is such that the work is carried out by executing a plurality of programs sequentially, there is proposed a means for automatically performing a series of operations while determining which work to be continued based on ending codes. However, with this means, as with the layout work for an LSI, in the event that a processing procedure is adopted in which even if some errors are detected during the execution of the programs, the work is to be continued as it is, and a series of work has been executed for completion without omissions in the end, the system shown in FIG. 1 cannot deal with such an event.

Then, in a second embodiment of the present invention, the history management of program executions is carried out such that even if some errors are detected in the course of execution of a series of programs, work is to be continued as it is, and the confirmation of whether or not a series of work is executed as predetermined and without omissions and errors in the end is ensured to be carried out.

In the second embodiment, in order to confirm whether or not the work performed by executing the series of programs is carried out properly, execution history information such as the program name, starting and ending times of the programs, ending code, the name of a person who executes the programs, the number of editions of the programs, and locations and types of errors is stored in the history data storage unit 6 as an execution history file in the history data storage unit 6 every time each program is carried out for a certain data. Then, when the same program is executed a plurality of times, every time the execution program is executed, the execution history of the program which has already been executed and stored is replaced with a latest execution history and the replaced history is stored.

Whether or not the data has been created properly is confirmed based on an ending code, and whether or not a predetermined execution sequence has been observed can be checked by comparing with the predetermined execution sequence from the program names and execution times.

Even in the event that the same program has been carried out several times, since only a latest execution history is stored in the execution history under the same program name, the correctness of the data can be determined from the ending code, and additionally, in a case where a depending relationship exists in the executing order, the correctness of the order can be verified from the execution starting time in the execution history by referring to a predetermined order.

Next, referring to processing flows shown in FIGS. 5 and 6, the program execution history management in the second embodiment will be described.

Figure 5:
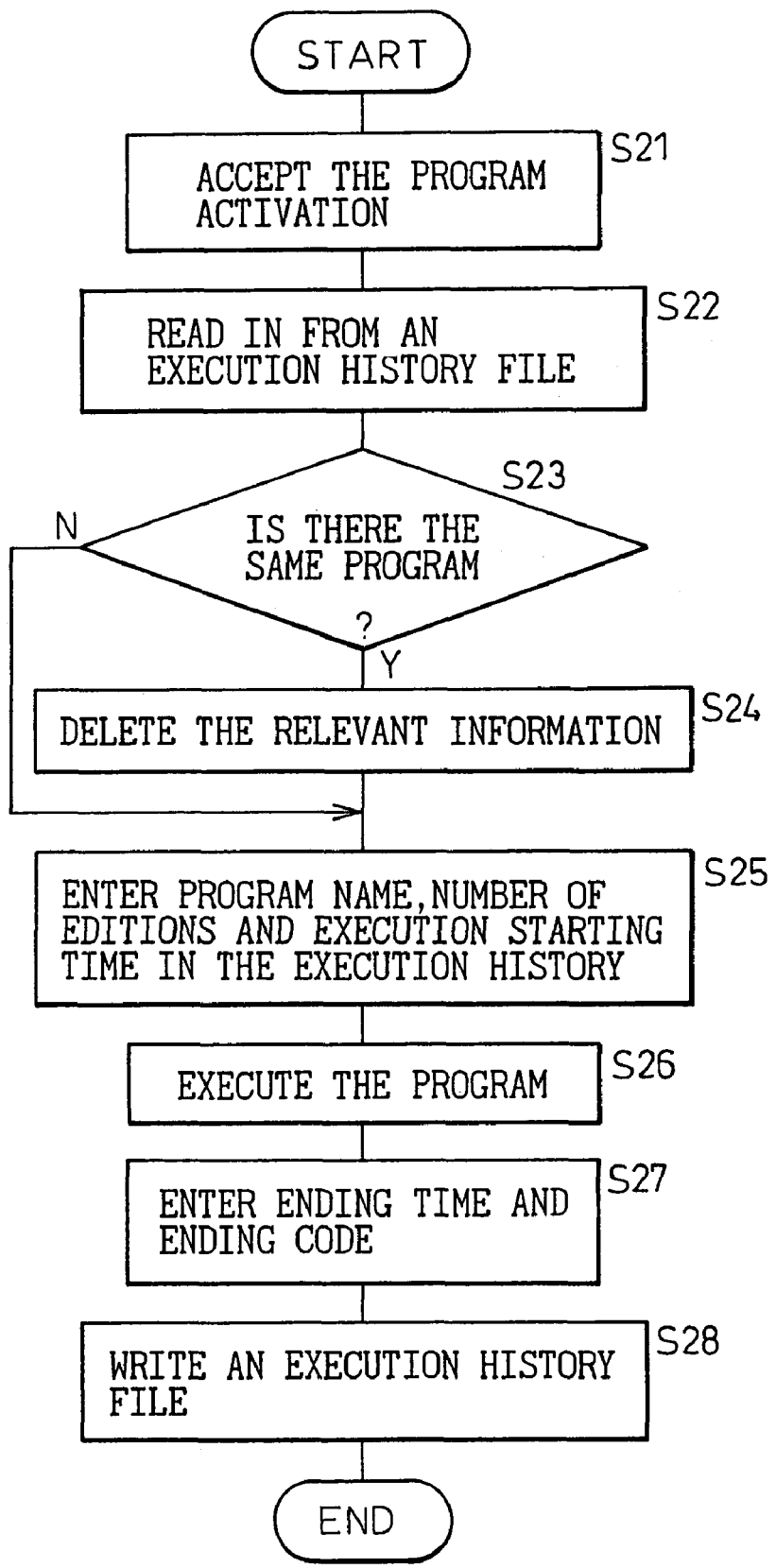
FIG. 5 is a flow chart showing a processing flow of creating a program execution history.
Figure 6:
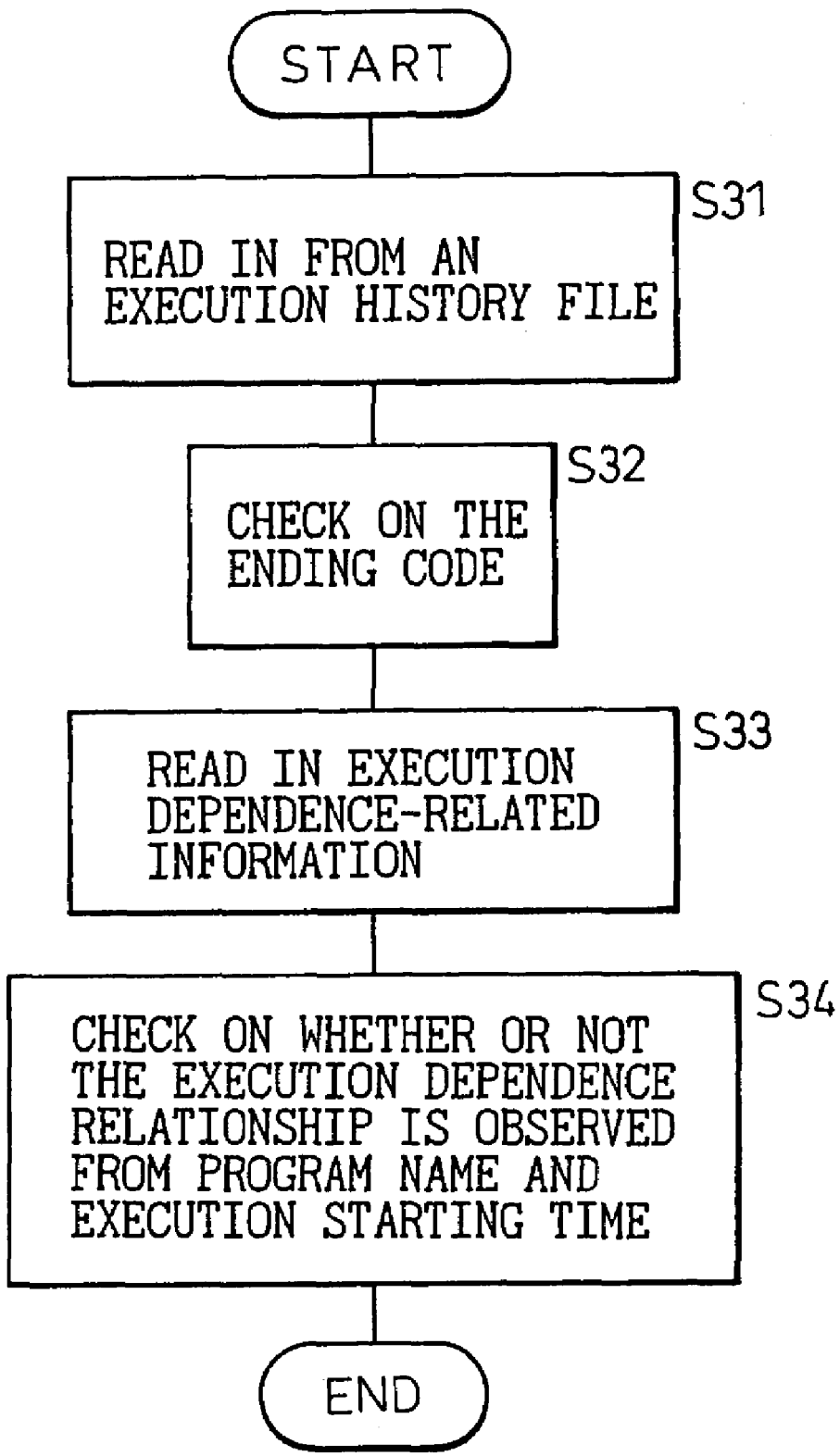
FIG. 6 is a flow chart showing a processing flow of checking through the program execution history.

A program execution history creating processing is shown in FIG. 5, and a check processing by a program execution history so created is shown in FIG. 6.

In creating a program execution history, first of all, when the operator instructs the start of certain work, the activation of a program associated with the work is accepted (step S21). An execution environment of the program is established.

The history management unit 16 reads in program names from an execution history file stored in the history data storage unit 6 (step S22).

As this occurs, whether or not the name of the program associated with the current work exists in the program names so read in is determined (step S23).

Here, in the event that the program name associated with the current work exists in the program names so read in (Y), execution history information related to the program name identical to the current program name which exits in an execution history file is deleted (step S24).

Then, the execution history information of the program to be executed currently is entered in the execution history file (step S25). In this case, the execution history information is constituted by the program name, the number of editions and the execution starting time.

On the contrary, in step S23, in the event that there is found no program name identical to that of the program to be executed currently in the program names so read in (N), as with step S24, since there is no execution history information to be deleted, it advances to step S25 to enter the execution history information of the program to be executed currently in the execution history file.

In step S25, the current program is executed, and work based on the current program is carried out by the operator (step S26).

When the work is completed and the program being executed is ended, an ending time, an ending code and the like are entered in the execution history information automatically (step S27).

Then, the execution history information associated with the program that has just been executed is written in the execution history file (step S28), and the creation of the program execution history is ended.

In addition, in a checking processing by a program history shown in FIG. 6, when the operator performs an ending processing of the relevant program, the history management unit 16 reads in an execution history file stored in the history data storage unit 6 (step S31).

Then, the ending code entered in the execution history file is checked (step S32). Whether or not work associated with the relevant program has been completed is checked.

Then, execution depending relationship information related to the relevant program residing in the layout database is read in (step S33).

Here, whether or not the execution depending relationship associated with the program is observed is checked from the program name, the execution starting time and the like in the execution history information of the program (step S34).

For example, in a case where there is caused a short circuit error in the net wiring as a result of placement of a cell, an area AR including a portion where the short circuit error occurs is re-displayed in the placement/net wiring window, and an error display is effected at the short circuit error occurring portion, whereby the operator is informed of the short circuit error. As this occurs, the short circuit error can be solved by modifying the placement of the cell, or the operator can move on to the following work while being aware that there is the portion where the short circuit error is occurring.

Thus, since the program execution history creating processing and the check processing by the program execution history are designed to be carried out in the program execution history management, even if some errors are detected in the course of the execution of the program, the work can be continued as it is, and the confirmation that the series of work has been carried out without omissions can be carried out in the end.

(Third Embodiment)

In a third embodiment, in the event that a modification to the cell placement/net wiring is carried out through an interactive edit from a point where a last save is effected in an editor for processing the placement/net wiring of cells as with the cell placement/net wiring processing system shown in FIG. 1, a list of objects which are modified is retained, while in the event that there has occurred no saving before, what has been modified since the data was read in is designed to be outputted.

Objects here include cells, net wirings and all that can be objects for edit in relation to the placement/net wiring of cells or those selected therefrom. In the event that an output of a list of objects is instructed, the retained information can be outputted in the list window screen.

In modifying the placement/net wiring in an interactive fashion, this embodiment can be used as a means for confirming whether or not an intended modification has been securely performed through an interactive edit, in a case where the scope and category for modification are known in advance.

Although outputting log information for reproduction of an interactive operation is a common practice, the log information is originally intended to reproduce the operation and is not intended to grasp what type of operation has been carried out.

In the event that a modification is made to the placement/net wiring through the interactive edit from the point where the last save was carried out in the editor for processing the placement/net wiring in an interactive fashion, the data of an object that has been modified, types of operations carried out and executing order of the operations are retained, so that they are outputted in the event that there is a direction to output the list. As an outputting method, an outputting based on a time series order of an outputting by category of objects can be selected. Note that when the data is saved once, after modified information modified prior to the save is outputted, modified information held inside is cleared.

Figure 7:
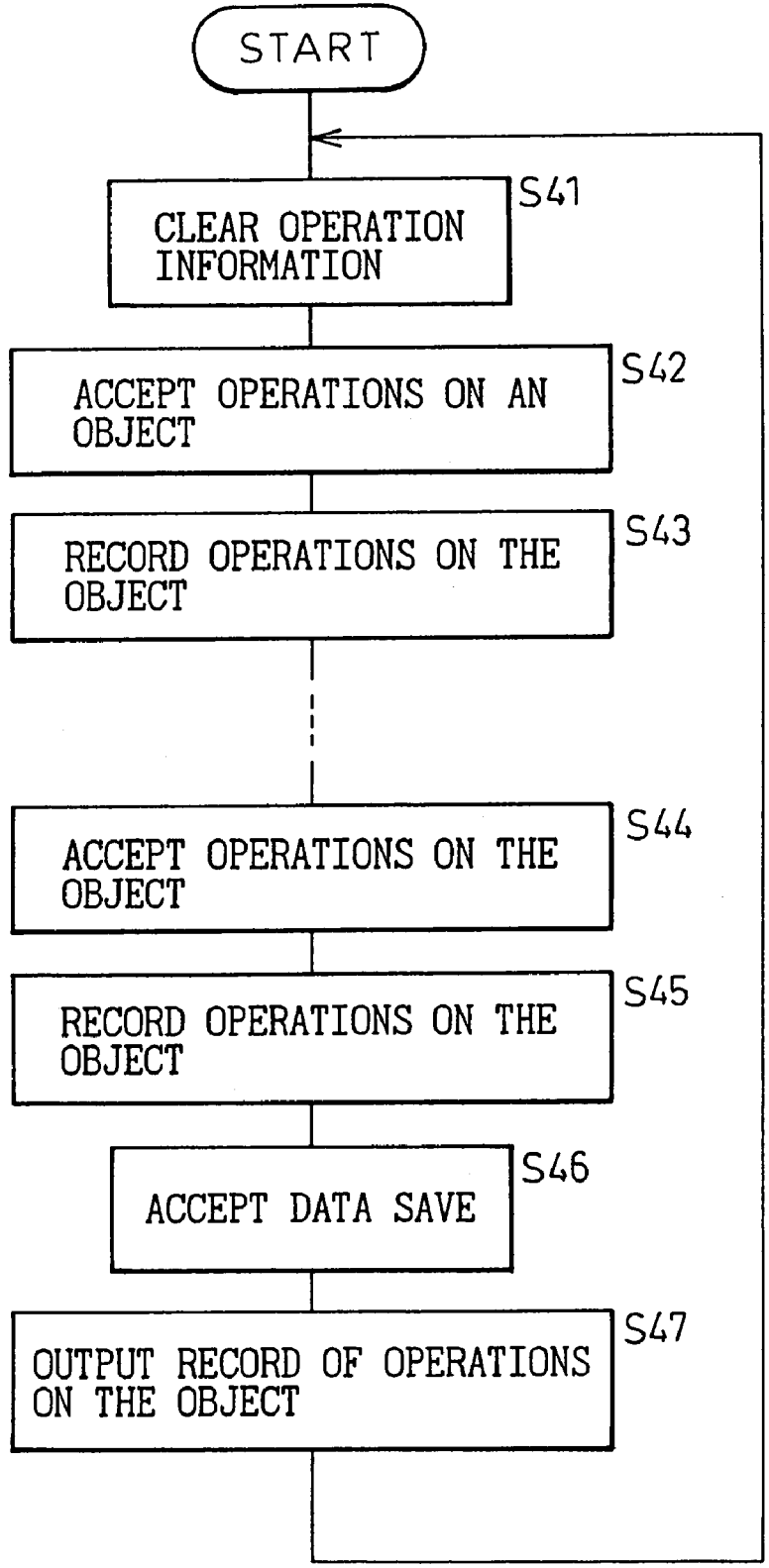
FIG. 7 is a flow chart showing a processing flow of recording operations to an object.

With reference a processing flow shown in FIG. 7, recording operations to objects will be described.

When an operation of an object is initiated in the placement/net wiring window, first of all, modified information related to the operations carried out on the objects including the last operation is cleared (step S41).

When an operation on the object is accepted (step S42), the contents of the operation are recorded as the operation is so performed on the object (step S43).

In the event that the operation is performed on the object several times, steps similar to steps S42 and step S43 are carried out every operation on the object (step S44 and step S45).

When an instruction is issued and accepted to save data related to the placement/net wiring at a break between the operations on the objects (step S46), the record of the operations that have performed on the object is then outputted (step S47). After the output of the record, it returns to step S41, and the recorded operation information is cleared for recording operations to be performed on the object until the next data saving.

In the event that a list of records of operations performed on the object is designed to displayed in the placement/net wiring window in relation to the output of operation information, the operator can confirm that the intended modification has been carried out by looking at the list so displayed.

Here, a specific example of outputting the record of operations on the object.

Saving time: \*\*/\*\*/\*\*,\*\*/\*\*/2000
Current time: \*\*/\*\*/\*\*,\*\*/\*\*/2000
[Placement]
Cell A: Cell A placement
Cell B: Cell B move
Cell C: Cell C placement
Cell D: Cell D move

[Net Wiring]
  net wiring 1: net wiring 1 modified
  net wiring 2: net wiring 2 modified
  net wiring 3: net wiring 3 modified Here, displayed under the [Saving time] is a time when the last save was carried out, and in the event that there has occurred no save before, no time is displayed. Displayed under the [Current time] is the current time when the current display has been carried out.

In addition, displayed under the [placement] is a list of cell names and macro names of cells that have been modified, and displayed under [net wiring] is a list of the macro names of those of the wiring names where wires and vias are modified.

Thus, according to the third embodiment, since a target object, types of operations and additionally the order of operations are internally recorded for modification to the object during the interactive operations initiated from the data read-in or data save, the information can be outputted as required in performing operations on the object to thereby confirm whether or not the modifications are carried out as intended.

(Fourth Embodiment)

In the third embodiment, the lists of operations performed on the individual objects are recorded and displayed in an enumerated fashion for each placement/net wiring processing.

In a fourth embodiment, main events that are executed from the activation through the end of an edit of placement/net wiring are designed to be recorded as an execution history, such as the save of data or a summary of operations that are carried out until a data is saved (whether or not the placement of a cell is to be modified, whether of not the net wiring is to be modified).

The summary of operations does not enumerate operations carried out on individual objects but records information only which indicates which object groups are modified.

The fourth embodiment is used in carrying out a modification through an interactive edit as a means for confirming that only the cell placement needs to be modified but the wiring does not have to be touched through the interactive edit in a case where a category to be modified is known in advance, such as in a case where it is known that only the cell placement needs to be modified but the wiring does not have to be touched.

Every time main events (the save of data or read-in of other data) take place, event information therefore is outputted, and at the same time information inherent in the event is added and the result thereof is outputted as an execution history. The output can be displayed on the window screen in the form of a list.

In the event that ever time main events (the save of data or read-in of other data) take place, event information therefore is outputted and at the same time information inherent in the event is added, for example, at the time of saving, the category of the modified object is extracted from the information in the third embodiment for addition, and when a check on the placement is executed, for example, as an event, the number of errors as the result of the check or the like is added as information inherent therein.

Next, a specific example of the summary of operations which is recorded as an execution record will be illustrated.

"start (\*\*/\*\*/\*\*,\*\*/\*\*/2000) end (\*\*/\*\*/\*\*, \*\*/\*\*/2000) code=0
  block name (TSM)
  save(\*\*/\*\*/\*\*,\*\*/\*\*/2000) modification Comp Net Mpin
  read(\*\*/\*\*/\*\*,\*\*/\*\*/2000) file name
  placement check(\*\*/\*\*/\*\*,\*\*/\*\*/2000) 4 errors"

Here, a time when the last save was carried out is displayed under the "save," and those that have been modified since the program was activated until the last save has been carried out are displayed after the "modification." In the above specific example, for instance, it is indicated that modifications took place for the "Comp," "Net," and "Mpin." Examples that are to be displayed after the "modification" are as follows.
  Frame: block frame
  Comp: component (cell, block, sub-chip)
  Net: wires, vias
  Mpin: module pin.
  Site: site
  Rinh: wiring area, wiring prohibited In the event that these items are saved a plurality of times, a transition state since the state prior to the activation is displayed.

The time when the data was last read from the outside and the file name thereof are displayed under the "read," and the time when the last check was carried out on the placement and the number of errors detected are displayed under the "placement check."

(Fifth Embodiment)

An interactive placement/net wiring editor has a sampling function for following the cursor position displayed in the placement/net wiring window so as to display information on the contents existing therein in the sampling window.

However, with this sampling function, when the cursor is moved over the placement/net wiring window, information on positions designated as the cursor is moved, for example, contents information such as cells, net wiring or the like are displayed in the sampling window. In a case where after a first cell is designated by the cursor, the cursor is moved to a cell at another position for a certain operation, the information on the first position disappears, and therefore, even if the operator wants to refer to the information on the first position while operating on the cell at another position, information on the contents of the cell at another position is displayed, thus it is not possible to see the information on the first position.

Due to this, in the fifth embodiment, a sampling hold function is provided for keeping the previous sampling display even if the cursor is moved, and a selection is made possible between a mode of fixing the sampling display and a mode of releasing the fixed sampling display.

When looking at the display example in the placement/net wiring window PNW shown in FIG. 2, for example, when the cursor is moved to stay in the frame of the cell A, the contents information of the cell A is displayed in the sampling window SW. The information can include the position related to the cell A, the connecting relationship with others, functions and the like.

Next, the cursor is moved to the cell B for an operation thereon, and in the normal sampling display, the contents information of the cell B is displayed in the sampling window SW. However, here, the operator wants to refer to the contents information of the cell A, the display fixing mode can be set by depressing a predetermined key while the cursor stays within the cell A. As the predetermined key for this purpose, the mouse 31 can be used to click on the cell A.

Thereafter, even if the cursor is moved, the contents information of the cell A is fixed to remain in the sampling window SW. The sampling display is fixed by suppressing the sampling function internally irrespective of the movement of the cursor.

In addition, when searching for the cursor within the placement/net wiring window PNW, the operator may feel like restoring the normal sampling display. As this occurs, the mode of releasing the fixed display is set by depressing another predetermined key. For this purpose, too, the operator may also operate the mouse 31 to move the cursor to the inside of the cell A to thereby click on the same cell for releasing the fixed display, without preparing another key.

Since, in the fifth embodiment, the sampling function is configured such that the selection can be made between the display fixing mode and the fixed display releasing mode, this helps the operator carry out easily operations required for placing or moving cells and adding, deleting or modifying the net wiring.

(Sixth Embodiment)

In an interactive placement/net wiring editor as shown in FIG. 1, information described on a user text file created and stored by the user (coordinates, graphics, texts and the like) is configured to be displayed in the list window.

When the operator designates the display of user text file information from the operation designating unit 3, the data management unit 15 reads in the information (coordinates, graphics, texts and the like) described on the user text file stored in a user text file storage unit 8. The information so read out is processed at the display data creating unit 13 and the display control unit 14, and graphics or the like are displayed at designated coordinates on the display screen 21 of the display unit 2, whereby a designated text is related to the graphics or the like so displayed.

The information (coordinates, graphics, texts and the like) described on the user text file is treated the same as graphics of cells and texts related thereto which are processed inside the editor installed in the layout database.

A specific example of a description on the user text file will be illustrated as below.

"HEAD:

COMMON GRID=grid value:

INF 1 ID list data POS (X coordinate, Y coordinate);

INF 2 ID list data MIN (X coordinate, Y coordinate) MAX (X coordinate, Y coordinate);

END:"

The information by the user is described between a "HEAD" sentence and an "END" sentence, and the sentences always terminate with ":". A comment can be described where blank characters can be described. A comment can be described within a scope surrounded by "/*" and "*/".

In the event that the "INF 1" sentence and the "INF 2" sentence are described in grid values, grid values are to be designated by the "COMMON" sentence. Graphics are to be displayed at positions resulting by multiplying X coordinate and Y coordinate by the grid values.

Data to be displayed in the list window LW is described in the "list data" in the "INF 1" sentence and the "INF 2" sentence.

Figure 8:
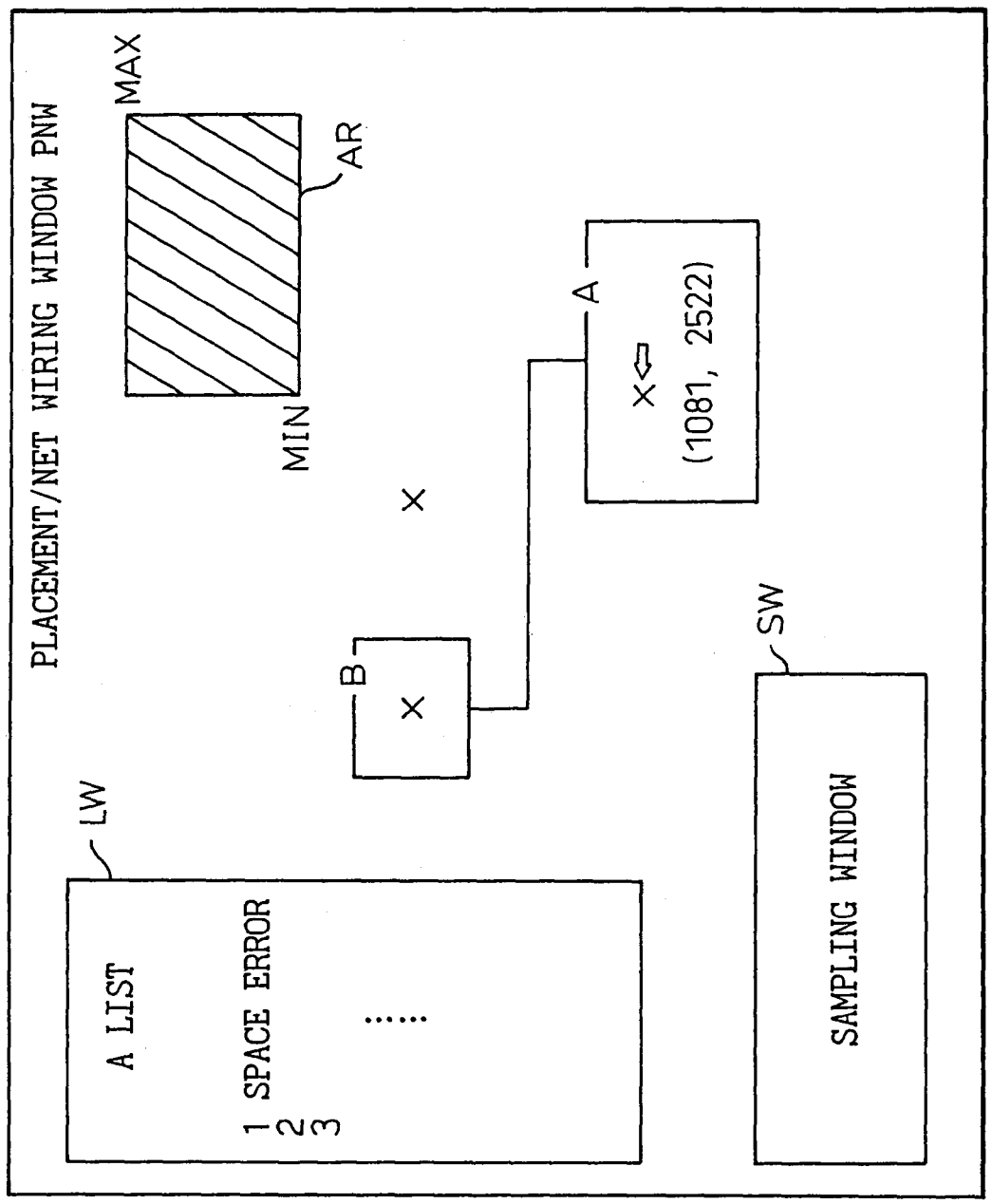
FIG. 8 is another display example displayed on an editor screen.

Here, shown in FIG. 8 is an example that is displayed in the placement/net wiring window PNW based on the information described on the above user text file.

In the event that the "list data" of the "INF 1" sentence is a space error, a "space error" is displayed in the list window LW. Then, since the X coordinate and Y coordinate are described in the "INF 1" sentence, for example, the coordinates are related to the cell A, then an X mark is displayed at the position.

In addition, in the event that the display of the information in the "INF 2" is selected, the information described in the "list data" is displayed in the list window LW. Then, since maximum and minimum values are described for the X coordinate and Y coordinate, respectively, in this case, for example, it is appreciated that a particular area AR on the block is designated, and a frame is displayed at a position corresponding to those coordinates in the placement/net wiring window. Furthermore, it is highlighted that the displayed frame is displayed based on the user text file information. In FIG. 8, slant lines are given to the relevant area or the relevant area is shaded.

Additionally, for example, when the cursor is aligned with the X mark inside the cell A, the contents information on the cell A is displayed in the sampling window SW.

Thus, since the user text file information created by the user is configured to be displayed in the placement/net wiring window PNW, operations can be easily performed for placing cells and net wirings or modifying the placement thereof.

(Seventh Embodiment)

In the sixth embodiment, the information described on the user text file stored in the user text file storage unit 8 is displayed in the placement/net wiring window PNW or the list window LW.

In a seventh embodiment, using the display function of the user text file information, the operability of the interactive placement/net wiring editor is improved which is provided with a find function, a go-find function and a sampling function.

In the interactive placement/net wiring editor as shown in FIG. 1, in the event that the information (coordinates, graphics, texts and the like) described on the user text file stored in the user text file storage division 8 is displayed in the placement/net wiring window PNW or the list window LW, the described information can be verified on the window screens with the find function, the go-find function or the sampling function.

The information (coordinates, graphics, texts and the like) described on the user text file is read in, a designated graphic is displayed at designated coordinates and a designated text can be related to its graphic.

The description contents of the related text are displayed as sampling information in the sampling window SW when the cursor is placed on the related graphic.

In addition, when a command for the find function is selected, the text so read in is displayed in the list window LW. When the cursor is aligned with the text displayed in the list window LW, the specific text being click selected, for example, a graphic corresponding to the text will be highlight displayed on the editor screen. If there exists no graphic corresponding to the text on the editor screen, the screen moves to a position of the graphic so selected by selecting a command for the go-find function.

(Eighth Embodiment)

In an interactive placement/net wiring editor, in a case where the user has an object with reference to specific information, or, for example, an object which he or she wants to display on the editor screen with a certain intention, the information is described in the user text file in advance, and then the information is read in so that a corresponding object on the editor screen can be highlight displayed or, for example, colored in a specific color for display.

In the interactive placement/net wiring editor, a cell name, a color specified therefore and a text are read in as information described on the user text file, a corresponding cell name is searched for in the inside data, and the cell is colored in the specified color which is read in from the user text file. In addition, in the event that the text is also designated, the cell and the text so designated are related to each other.

By configuring the editor as described heretofore, the specific cell can be colored for designation for the purpose of attaching to the cell a certain meaning for the user from the outside, whereby the specific cell can be visible.

An example of description to the file in this case will be shown below.

"HEAD;
COMP ID cell name color "comment";
COMP –1 SEP 1 "separator character line"

Here, the "COMP" denotes an identification character line, and the "ID" a number displayed on the "INF" list. When –1 is designated for the "ID", the line is handled as a separator line.

A cell name is designated for the "cell name." The cell name is ignored in the case with the separator line.

For example, any of the following 15 colors may be selected as a designation for the "color." The designation can be made with either of the color number or the color name.

| [color number] | [color name] |
|---|---|
| 1 | red |
| 2 | orange red |
| 3 | dark orange |
| 4 | gold |
| 5 | yellow |
| 6 | greenish yellow |
| . | . |
| . | . |
| . | . |
| 14 | royal blue |
| 15 | blue |

Note that the color designation is ignored for the separator line and the separator line is displayed in white. Any of optional character lines displayed in the sampling window SW is described in the "COMMENT" and the number of characters therefore is to be within 127 characters. A separator character line is designated for the separator line.

The case has been described heretofore in which the cell name is read in out of the information described on the user text file, the cell name corresponding to the cell name is searched for in the inside data, and the cell so searched for is colored in the specific color for display, similarly, out of the information described on the user text file a net name, a color therefore and a text are read in, whereby a specific net can be colored in a specific color for indicating that the user has a certain intention on the editor screen.

An example of description to the file in this case will be illustrated below.

"HEAD;
NET ID NetName Color "COMMENT"
NET –1 SEPT 15 "separator character line";
END;"

Here, the "NET" describes an identification character line associated with the net wiring, and a net name associated the wiring is designated for the "Net Name." The net name is ignored for a separator line.

The "ID", "Color" and "COMMENT" are handled similarly to the previous example.

Thus, in the interactive placement/net wiring editor, the information on the object which the user wants to display with a certain intention is described on the user text file, the information is read in when the user wants to display the object, information corresponding to the information is searched for within the inside data and the information so searched for is colored in the color read in from the outside, whereby the information which is colored with the certain intention by the user from the outside can be visible on the editor screen.

(Ninth Embodiment)

In an interactive placement/net wiring editor, in designing the layout of an LSI, operations for placing or moving cells or adding, deleting or modifying wirings are repeatedly performed. In such a case, there occurs a case in which a plurality of places need to be sequentially referred to for verification.

Due to this, mark creation is carried out in which marks are affixed to places needing to be verified later on such as areas, cells, wirings or the like. Then, when the operator wants to see the place where the mark is affixed, a mark referring mode is designated. Then, a screen is displayed which shows that a mark is affixed to the placement/net wiring editor window screen.

In addition, in a case where marks are affixed to a plurality of places, the screens are scrolled in the order in which the marks are affixed so as to display the marks. After the last screen appears, then the screen returns to the screen showing the mark initially affixed. The scrolling display of these screens is effected within in the size of the area currently displayed or the current magnification.

For a case where a plurality of marks are created as described above, an example will be illustrated in FIG. 9 in which marks are affixed to the area.

In the course of designing the layout of an LSI, a mark, X1, is affixed to an area AR1 displayed in the placement/net wiring window PNW1. When this mark is affixed, a mark creating mode is selected, the cursor is moved to a position where a mark is to be affixed, and the position may be pointed to. Then, the mark, X1, is displayed at the position where the cursor stays. In the same way, a mark, X2, and a mark, X3, are affixed sequentially to areas AR2 and AR3 and such markings are stored.

Next, when he or she wants to see the plurality of screens, the operator selects the mark referring mode, the area AR1 on which the first mark, X1, is affixed is displayed in the window PNW1, and then, the area AR2 to which the next mark, X2, is displayed in the window PNW2 at a regular interval. The "next" may be designated instead of displaying the windows at the regular interval.

When the area AR3 to which the last mark, X3, is affixed is finally displayed in the window PNW3, the display returns to the screen displaying the area AR1 to which the first mark, X1, is affixed. In addition, in the event that the reference is initiated from the area to which the intermediate mark is affixed, it may be configured that the display returns to the area where the reference is so initiated.

In displaying the series of areas, the magnification is adjusted such that the sizes of the areas AR1 to AR3 come similar to each other. As this occurs, the respective areas are able to be compared with each other in an eased fashion.

In the event that the operations for placing or moving cells or adding, deleting or modifying wirings are performed repeatedly, the plurality of places can be referred to sequentially automatically, this simplifying the verification.

(Tenth Embodiment)

In an interactive placement/net wiring editor, a plurality of cells arranged within a specific area are re-arranged to designated positions on the editor screen. With this end, a cell re-arranging mode is provided for designation.

An area involving a plurality of cells that are to be replaced to designated positions is selected on the editor screen. The replacement is carried out for each of the plurality of cells existing within the selected area in accordance with space and pitch values, and aligning mode and aligning type which are all set on other control screens.

A specific example of the space or pitch value and the aligning mode and the aligning type which are all set on the control screen will be as follows.

(Space, Pitch)

Values for a space between cells or a pitch between positions where cells are disposed is set at actual coordinate values.

(Aligning Mode)

Left: replace to left-justify the cell
Right: replace to right-justify the cell (Aligning Type)

Channel: a blank area between cells is replaced at the space value or the pitch value.
Pitch: a space at the end which constitutes a reference to the cell is replaced at the space value or the pitch value.
One: align the position of each cell positioned at the left end or the right end.

The replacement of the plurality of cells will be described with reference to FIGS. 10A to 10D.

Figure 10A:
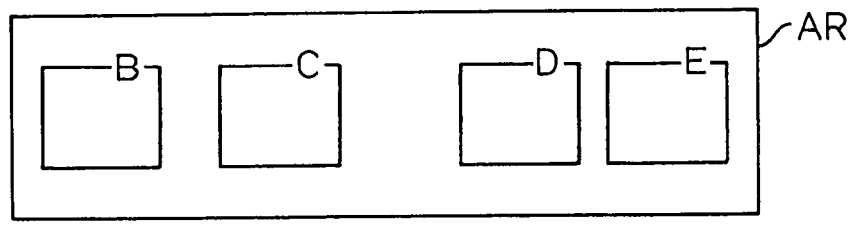
FIGS. 10A to 10D are diagrams showing display examples displayed when cells are replaced on the editor screen.

In FIG. 10A, an area AR displayed on the editor screen is shown, and a plurality of cells B to E are disposed in the area AR. A case is illustrated in FIGS. 10B to 10D, respectively, in which the plurality of cells so disposed are replaced to designated positions.

Figure 10B:
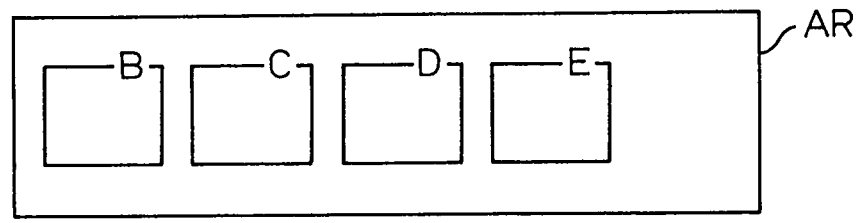

FIG. 10B shows a state in which the plurality of cells B to E are replaced in the area AR from the state shown in FIG. 10A at a space value designated under the "space, pitch." The "aligning mode" is the "Left," and the "aligning type" is the "Channel."

Figure 10C:
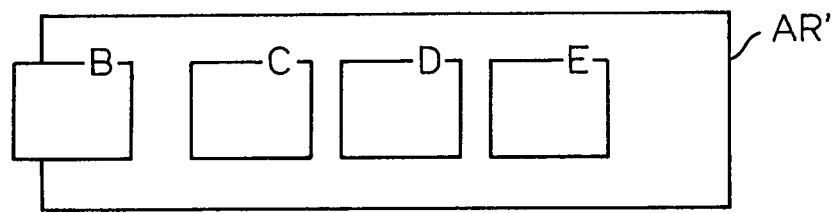

When the scope within the area AR is selected for replacement of the plurality of cells B to E, for example, a case is shown in FIG. 10C in which the setting of the scope in the area AR is mistakenly carried out, whereby the left end of the cell B is caused to protrude from the scope. As this occurs, the cells C to E are made to be target cells with the cell B being dropped from the target cells, and the replacement is carried out with the cell C which is now being located at the leftmost end in the scope being made to be a reference cell for replacement. The replacement is carried out from the position where the cell C is located at the designated space value or pitch value.

Figure 10D:
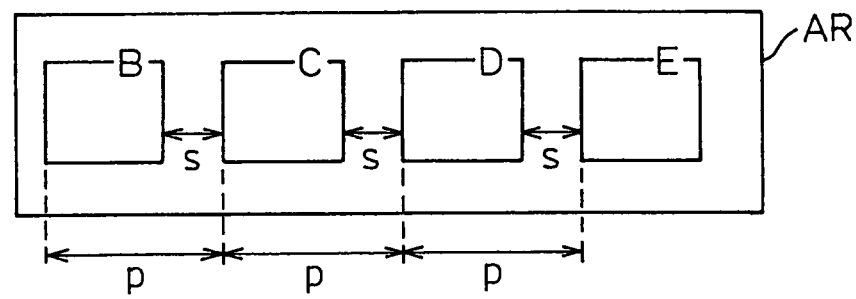

FIG. 10D shows a state in which the "Pitch" is selected for the "aligning type." Values for the space between cells and the pitch for cell placement are designated under "space," and "pitch," respectively, and the replacement is initiated from the position shown in FIG. 10A.

Note that in the event that the set pitch value p is set as smaller than a maximum value for the width in a direction of the X axis of the cells which become the target for replacement, the replacement processing is not carried out. In addition, when the space value s is also set, also in the event that a value (p−s) is smaller than the maximum value for the width in the direction of the X axis of the cells which become the target for replacement, the replacement processing is not carried out, either.

Thus, since the cell replacing mode is made to be designated, the plurality of cells which are disposed in the specific area can be aligned to the designated positions on the editor screen, this facilitating the replacement of cells.

(Eleventh Embodiment)

In the tenth embodiment, in the interactive placement/net wiring editor, the cell replacing mode is designated and the plurality of cells are replaced in accordance with the "aligning mode" and "aligning type."

In an eleventh embodiment, in a case where a circuit in which the arrangement of a plurality of cells is repeated needs to be laid out in areas selected on the screen of a placement/net wiring editor, the cell arrangement relationship in a group of a plurality of cells can be registered on the catalog by selecting a catalog command, and a catalog placement having the same arrangement relationship which is registered on the catalog can be carried out relative to another plurality of cells.

The following catalog registration and catalog placement will be carried out on the screen of the interactive placement/net wiring editor. This will be described with reference to FIG. 11.

A case where catalog registration and catalog placement are carried out concurrently:

First of all, after a catalog command is selected, cells displayed on the list window LW are selected in the placement/net wiring window PNW, and the placement processing is carried out in the same way as with the normal cell placement command. Cells A to E are placed within an area AR1, and a cell replacement in a twelfth embodiment is also ended.

Since the catalog command is selected, cell names "Cell A" to "Cell E" displayed in the list window LW are registered on the catalog sequentially. Since the positional information of the respective cells is recorded, the positional relationship information between the respective cells can be registered. The cells which are registered on the catalog are highlight displayed in, for example, red in the placement/net wiring window PNW.

A case where the cell placement information on the placed cells is registered on the catalog:

The cells A to E have been placed within the area AR1 in the placement/net wiring window PNW. Then, the catalog command is selected. Cells are selected whose placement information is registered on the catalog. For example, the cell names "Cell A" to "Cell E" displayed in the list window LW may be designated for selection sequentially with the cursor. Packaging information thereof is then registered on the catalog.

Thus, the plurality of cells can be registered on the catalog, and the catalog commend continues to be effective since it is selected until a repeat command is selected or until the catalog command is selected again. The selection of cells to be registered on the catalog is continuously carried out. Then, when the catalog commands are selected for the designated cells, the information which has already been registered is then cleared.

Next, a case will be described in which a catalog placement is carried out.

In carrying out a catalog placement, first of all, after the repeat command is selected, a leading cell of a plurality of cells which are to be placed in the area AR2, that is, the Cell F is selected from the placement target cells displayed in the list window LW. Then, a plurality of cells, Cells F to J, are selected by a number equal to the number of pieces of placement information which are placed on the catalog in the respective order of the list.

Then, the positional information placed on the catalog is then added to the positional information of the selected cells. Next, the placement position which becomes the reference point of cells which are to be placed on the catalog is designated in the area AR2 in the cell placement/net wiring window PNW. Then, the Cells F to J are placed in the area AR2 in the same placing relationship as that of the Cells A to E which are placed within the area AR1.

Thus, in a case where the circuit in which the arrangement of the plurality of cells is repeated is laid out, the arrangement of the plurality of cells can be repeated easily for placement of the cells relative to the known group by carrying out catalog registration and catalog placement.

(Twelfth Embodiment)

In an interactive placement/net wiring editor, in a case where a placement/net wiring relationship between a plurality of cells is grasped with ease, when a specific cell is selected in the editor screen, information associated with the relevant cell is designed to be displayed in accordance with selected find mode and find style.

When a specific cell is selected out of a plurality of cells displayed in the placement/net wiring window PNW, information associated with the cell is displayed based on the selection between the find mode for indicating a display target and the find style for indicating a display form. Specific examples of the find mode and find style will be displayed as follows.

[Find Mode] Set a Mode for the Find Command
All (the entire cell is highlighted): In/Out/Cell All to be target (the entire cell pattern)
Input: display a connection between the cell and an input pin
Output: display a connection between the cell and an output pin
Cell: only the cell is highlight displayed (in a single color of ret)
Cells (15 colors): only the cells are highlight displayed (in 15 colors)

Figure 12:
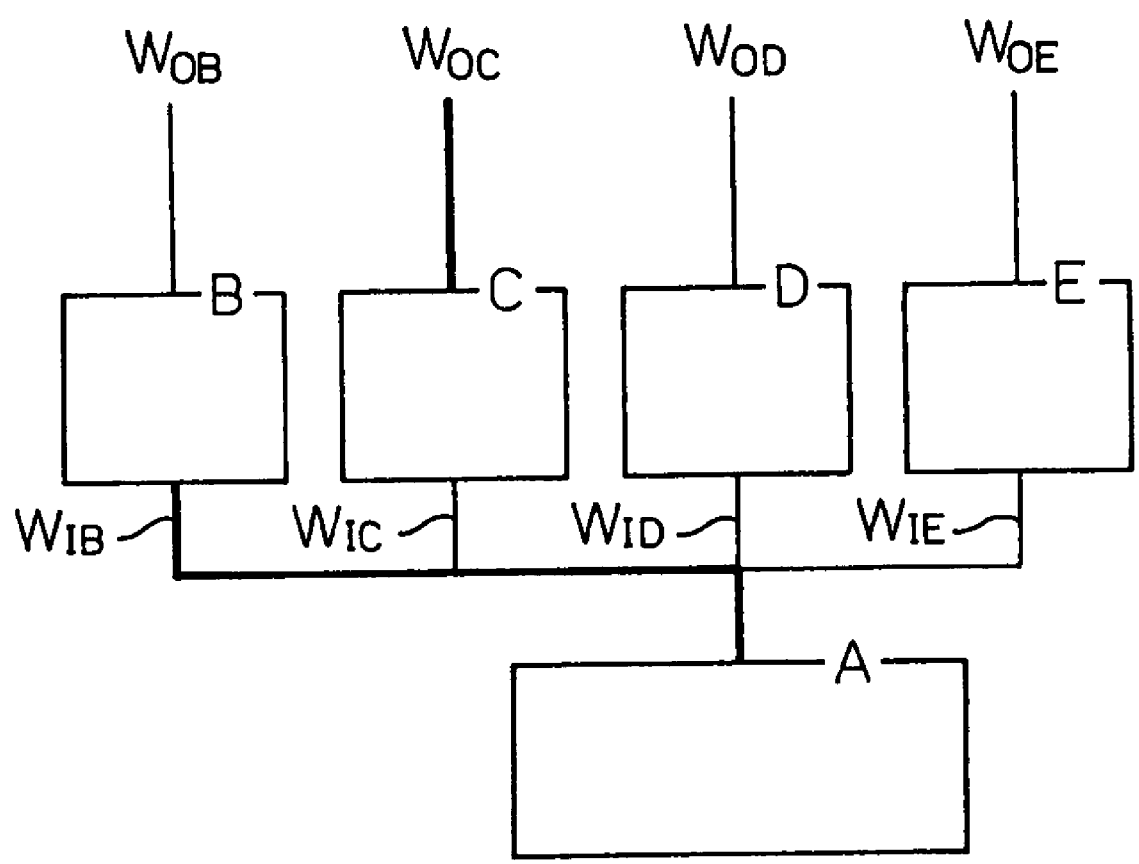
FIG. 12 is a diagram showing a display example when cell-related information is displayed on the editor screen.

[Find Style] Set a form for Display of the Find Command
Steiner: display in a Steiner tree-like fashion
Wire: display a wiring configuration for actually wired portions and portions to be wired
Star: display in a radiating configuration
ArcWire: display a wiring configuration for actually wired portions, and portions to be wired indicated by an arc shape line
ArcStar: display an arc shape line in a radiating configuration An example is shown in FIG. 12 in which the Cells A to E shown in FIG. 2 are set based on the find mode and find style as described above and are displayed on the widow screen.

After the placement of the respective cells A to E is completed in the placement/net wiring window PNW, the find command is selected. Then, for example, when the "input" is designated as the find mode, while the "Wire" is designated as the find style and the cursor is aligned with the Cell A for click, a wiring WIB is highlighted.

In addition, similarly, when the "output" is designated as the find mode, while the "wire" is designated as the find style and the cursor is aligned with the cell B for click, a wiring WOC is highlighted.

Thus, since the find command is made to be designated and setting the find mode and the find style is made possible, the status of placement and net wiring among the plurality of cells can be seen at a glance thereat, thereby making it possible to verify the cell placement/net wiring with ease.

(Thirteenth Embodiment)

In an interactive placement/net wiring processing editor, although the configurations of cells are the same in designing the layout of an LSI, the cells need to be inverted.

Cells to be inverted are selected on the editor screen, and the selected cells are inverted around the X axis or Y axis in accordance with a flip mode set on another control screen. Here, a plurality of cells can be put together so that a group designation is made possible. In the event that a group of cells is inverted, a group flip type which is set on another control screen is designated.

An specific example of a group flip type will be described below.

[Group Flip Type]
Total inversion: the entire group is mirror inverted.
Position replacement: only the positional relationship of the cells is inverted with the rotational code of the cells remain the same.
Single inversion: the cells are individually inverted while the positions where the cells are placed remain maintained.

Figure 13A:
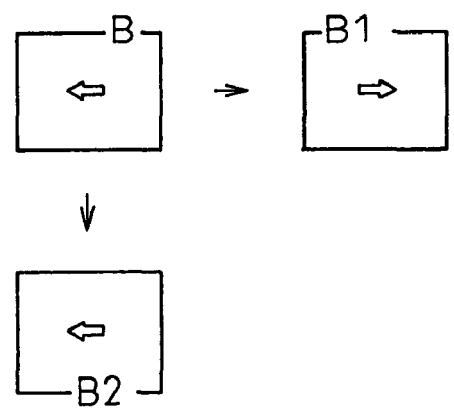
FIGS. 13A to 13C are diagrams showing display examples when group flipping is carried out on the editor screen.
Figure 13B:
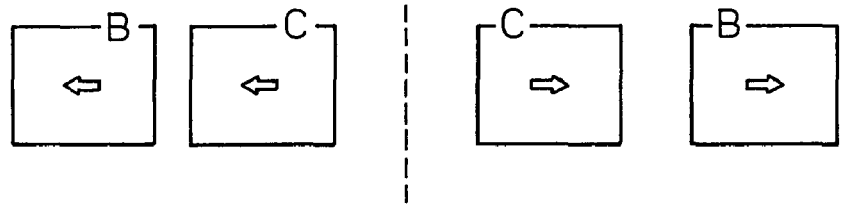
Figure 13C:
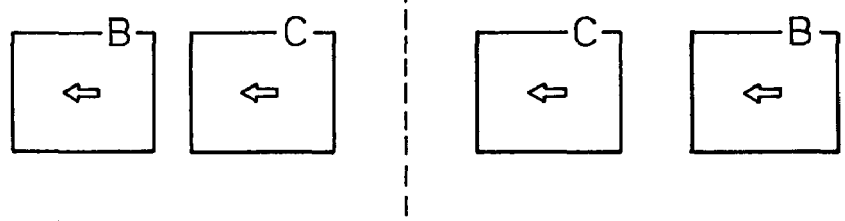

Referring to FIGS. 13A to 13C, specific inversion examples will be described which correspond to various types of group flipping.

FIG. 13A shows an example of the "single inversion" in which the Cell B within the area AR is single inverted. In the drawing, arrows are intended to clarify the directions of the cells. A case is shown on the right-hand side of the Cell B as Cell B1 in which the Cell B is simply inverted about the Y axis with the position where the Cell B is placed remaining unchanged. In addition, similarly, a case is shown below the Cell B as Cell B2 in which the Cell B is simply inverted about the X axis.

FIG. 13B shows a case of the "Total inversion" in which the two Cells B and C which constitute the group are mirror inverted about the X axis.

FIG. 13C shows a case of the "Position replacement" in which the respective positional relationships of the two Cells B and C which constitute the group are mirror inverted about the X axis with the orientations of the cells themselves remaining unchanged.

Thus, since the cell inversion mode can be selected for either the single cell or the group of cells, operations for placing cells in designing cell layouts can be simplified.

(Fourteenth Embodiment)

In an interactive placement/net wiring editor, when a cell is moved after it has been placed, if the cell moves, relationships between the cell and other cells become unclear, and therefore, the status of the moving cell is indicated by a rubber band.

In the interactive placement/net wiring editor, the display of the rubber band is controlled by the following mode while the cell is moving and being placed.

Figure 14:
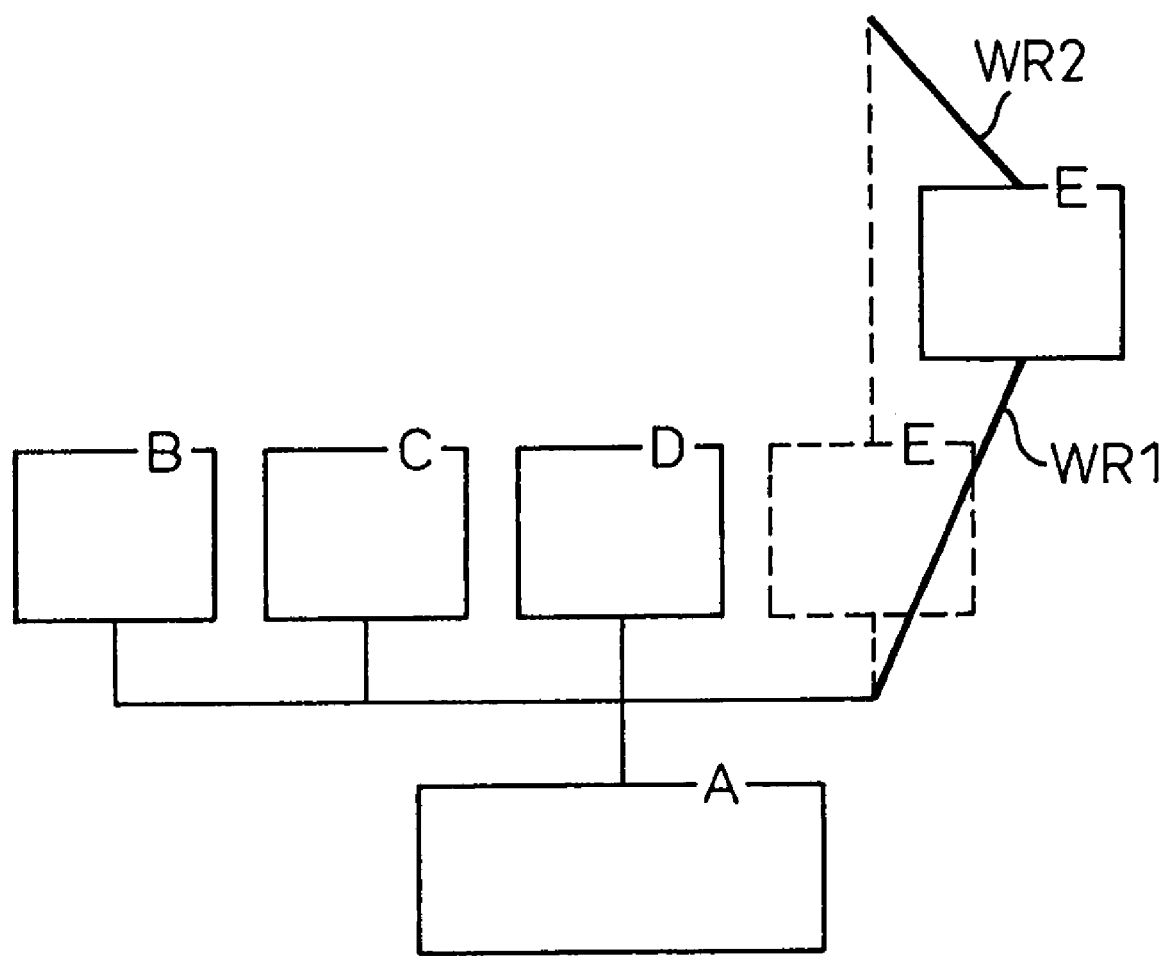
FIG. 14 is a diagram showing a display example when a net wiring rubber band display is performed on the editor screen.

[Rubber Band Mode] Rubber Band Display while the Cell is Moving and Being Placed
Total: normal display
Input: a wire connecting to an input pin is displayed
Output: a wire connecting to an output pin is displayed
Only clock: a wire of a clock system net is displayed
Except for clock: a wire except for a clock system net displayed
Non-displaying: no display occurs An example to be displayed on the window screen when a rubber band mode as described above is selected is shown in FIG. 14 in which the cells A to E shown in FIG. 2 are used as an example.

A rubber band command is designated, and after the cursor is aligned with the cell E, the cursor is moved while the mouse is being kept clicked. Then, while the cell E was initially displaced at a position indicated by broken lines, the cell E moves as indicated by solid lines as the cursor moves. As this occurs, wiring wires indicated by broken lines and wire WR1 and wire WR2 which are both indicated by solid lines extend or contract while indicating the connecting relationships between the cell E and the other cells as the cell E moves. The wires which extend or contract are highlighted.

Thus, when the placed cell is moved, the status of the moving cell can be grasped with ease.

(Fifteenth Embodiment)

In an interactive placement/net wiring editor, in designing layouts on the editor screen, in a case where respective cells need to be sequentially placed with the same placement relationship, when a placement command is designated, the placement of a cell following a cell which has already been placed can be controlled in a selected mode.

Specific examples of cell placement modes will be shown below.

[Placement Mode] Set a Mode for a Placement Command
  Normal: designate a placement position for each target
  Right: place a cell right to a cell placed immediately before
  Left: place a cell left to a cell placed immediately before
  Up: place a cell above a cell placed immediately before
  Down: place a cell below a cell placed immediately before To explain the modes using the example shown in FIG. 2, one of these modes, for example, the "Right" is selected, and the cell C is selected from the cell names displayed in the list window LW. Then, the cell C is placed right to the cell B in the area AR. The same will apply to the cell D.

Thus, in a case where a plurality of cells are sequentially placed in line with each other, when the placement command is selected, the cell placing operations in designing layouts can be simplified.

(Sixteenth Embodiment)

In an interactive placement/net wiring editor, in designing layouts on the editor screen, when a cell which has already been placed is moved for replacement, the replacement is carried out while the moving direction of the cell is fixed.

In the interactive placement/net wiring editor, the movement of cells is controlled by the following modes.

[Move Mode] Set Modes for a Move Command
  Normal: a cell is moved along X and Y coordinates as Directed.
  Fixed X coordinate: a cell is moved only in the Y axis direction while X coordinate is fixed.
  Fixed Y coordinate: a cell is moved only in the X axis direction while Y coordinate is fixed.

Then, the cursor is aligned with the placed cell, a move command is designated, and the move mode is selected. For example, when the "Fixed X coordinate" is selected, the cell to be moved moves on the screen as the cursor moves, but the cell moves only in the Y axis direction of the position where the cell stayed.

Note that in addition to the replacement of cells, this mode can also be applied to a case where a cell is selected from the list window LW so as to place the cell so selected at a position within the area AR. The aforesaid move command is designated, and the cursor is moved to the axis in the area where the cell is to be placed and the cell placement position is clicked on. Then, the cell is selected from the list window LW, and the cursor is moved within the area AR, whereby the cell can be moved to the movement of the cursor over the axis where the cell is to be placed.

Thus, the direction in which the cell is moved for placement thereof can be set, and even if the movement of the cursor is unstable, since the cell movement direction can be displayed in a stable fashion, operations for determining the cell placement position can be simplified in designing layouts.

(Seventeenth Embodiment)

In an interactive placement/net wiring editor, there often occurs a case where wiring needs to be copied when designing layouts for LSIs on the editor screen.

In such a case, a wiring copy command can be designated by aligning the cursor with a point on a wire to be copied and clicking on the point. When this wiring copy is selected, a drag graphic of a wiring which is a target for copying is displayed, and the wiring can be copied by aligning its end point with a terminal position of a net where the wiring is to be copied.

According to the configuration, wiring operations can be simplified when designing layouts.

(Eighteenth Embodiment)

In an interactive placement/net wiring editor, there often occurs a case where a wire which has already been laid out needs to be moved in designing layouts on the editor screen. As this occurs, in the event that a specific wire is moved, the wire moves away from vias or other wires to which the wire connects, and therefore, the wire needs to be connected to the vias or the other wires again after the wire has been moved.

To cope with this, wiring is adapted to extend in conjunction with the movement of a wire by selecting one point on a wire to be moved and then selecting a location to which the wire is to be moved. Wires connecting to the wire are adapted to automatically extend or contract in conjunction with the movement of the wire, and vias connecting to the wire are also adapted to automatically move as the wire moves.

Referring to FIGS. 15A to 15D, a state will be described in which a wire is allowed to extend by selecting one point on a wire to be moved and then selecting a location to which the wire is to be moved on the editor screen.

In FIG. 15A, a via B1 and a via B2 are disposed at a position P1, and a wire W is provided to connect to the vias. Further, a wire W1 is connected to the via B1, and a wire W2 is connected to the via B2 in such a manner as to extend in the same direction as that in which the wire W1 extends.

Here, when the wire W is tried to be moved from the position P1 to a position P2, the cursor is aligned with one point on the wire W and a wiring stretch command is designated. Then, the cursor is moved in a direction indicated by an arrow as shown in the figure, and the position P2 is selected. Then, as the wire moves, the vias B1 and B2 move, and the wires W1 and W2 extend while being connected to the wire W1.

A case shown in FIG. 15B is identical to that shown in FIG. 15A except that a wire W2 connects differently. Namely, the wire W2 connects to a wire to be moved in such a manner as to extend in a direction opposite to the direction in which a wire W1 extends.

Here, when the wire W is to be moved to a position 1 to position 2, the cursor is aligned with one point on the wire W, and the wiring stretch command is designated. Thereafter, the cursor is moved in a direction shown by an arrow as indicated in the figure, and the position P2 is selected. However, since the wire W1 and the wire W2 are opposite to each other in direction in which they extend, as the wire W moves, the wire W1 extends in conjunction with the movement of the via B1, while the wire W2 contracts in conjunction with the movement of the via B2.

FIG. 15C shows a case where a laid out wire W1 terminates at a position P1.

The cursor is aligned with a terminal end of the wire W1 or the position P1, and the wire stretching command is designated. Next, when the cursor is moved to a position P2 as indicated by an arrow in the figure, the wire W1 itself extends in conjunction with the movement of the cursor, and the extension of the wire is so displayed.

FIG. 15D shows a case where a via B1 is placed at a laid out wire W1.

The cursor is aligned with the via B1 and the wiring stretch command is selected. Next, when the via B1 is moved to a position P2 as shown by an arrow in the figure, the wire W1 itself extends in conjunction with the movement of the cursor, and the extension of the wire W1 is so displayed.

Thus, since the wiring stretch command can be selected, a wire connecting to cells, vias, other wires or the like can be extend or contract as they move, whereby the wiring operability at the time of layout design can be improved.

(Nineteenth Embodiment)

In an interactive placement/net wiring editor, there occurs a case where information related to wiring needs to be modified while designing layouts on the editor screen. To cope with this, among information on laid out wires only information on types of wiring is allowed to be modified while information on position of wires remain unchanged.

Figure 16A:
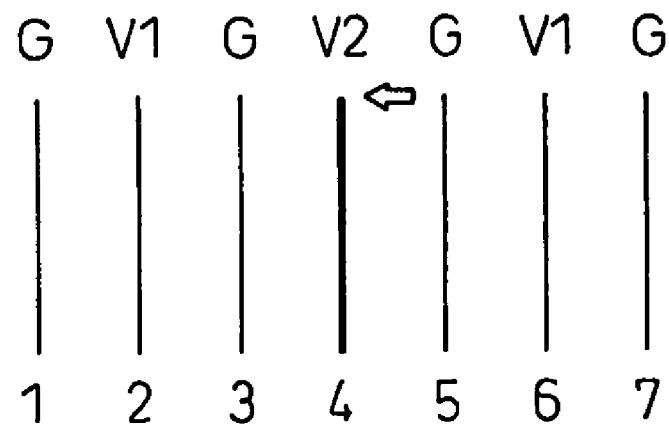
FIGS. 16A and 16B are diagrams showing specific examples when information on types of net wiring is modified on the editor screen.
Figure 16B:
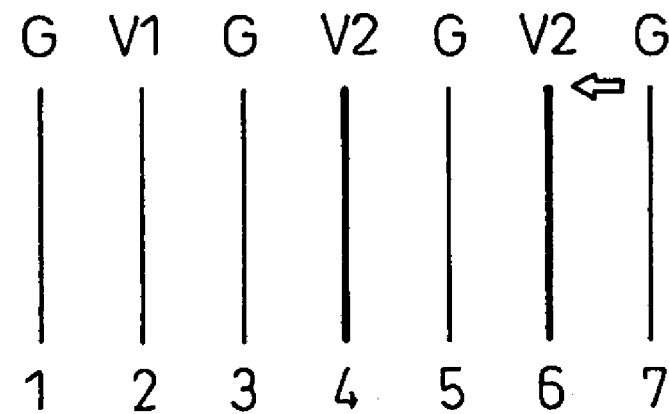

A specific example of such a modification to wiring is shown in FIGS. 16A and 16B.

FIG. 16A shows a state in which wires 1 to 7 are laid out as a step, in which the wires 1, 3, 5 and 7 are grounded G, while the wires 2, 4 and 6 are powered. However, there are two types of powered wires, and the information on types of wiring is modified with respect to the wire 4 so that the voltage thereof is changed from a voltage V1 to a voltage V2. However, when the voltage also needs to be modified from the voltage V1 to the voltage V2 with respect to the wire 6, the information on types of wiring also has to be changed for such a modification.

Then, the cursor is aligned with one point on the wire 4 as shown in FIG. 16A and one point on the wire 6 which needs a modification as shown in FIG. 16B, and a wiring modification command is designated for each wire. As this occurs, as shown in FIG. 16B, only the information on types of wiring of the wire 4 is copied with respect to the wire 6, whereby the voltage of the wire 6 is modified from V1 to V2. Note that the wiring modification command may be first designated, and then wires be selected, respectively, whereby the wiring types information of the wire first selected may be copied on the wire selected later.

Thus, since only the wiring types information can be modified by designating the wiring modification command, only the types of wires can be modified without modifying the positions of other laid out wires and vias, whereby operations for modification in layout design can be simplified.

(Twentieth Embodiment)

In an interactive placement/net wiring editor, an overlap check can be performed while designing layouts on the editor screen by predicting the width of wiring of a net connecting to a packaging hierarchy block terminal (module pin) from the attribute of the connecting net and the wiring layer.

The module pin overlapped placement check during designing layouts was a check at grid coordinate points. Due to this, in wiring needing thick wires such as with clock system nets, there used to occur a problem that those thick wires overlap each other. In addition, such a problem could not be found until wires were actually laid out.

Wiring for connection of module pins will be described with reference to FIG. 17.

Figure 17:
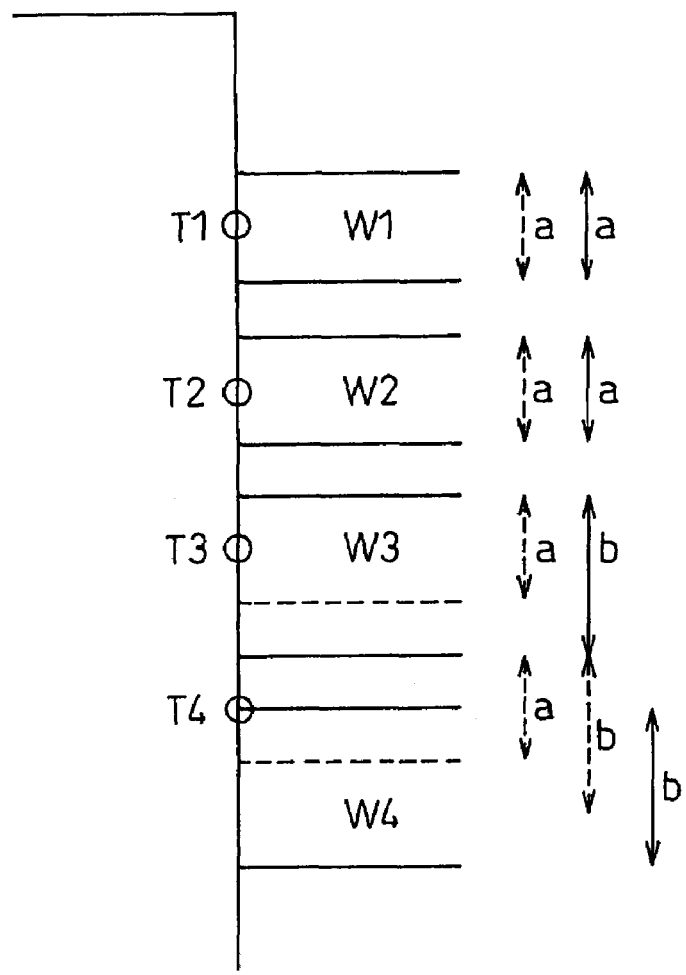
FIG. 17 is an explanatory view showing how checks are carried out on net wiring overlapping and placement.

FIG. 17 shows that module pins T1 to T4 of an LSI block are displayed on the editor screen. The positions of the module pins T1 to T2 shown here are grid coordinate points. In the event that a module pin placement check is carried out in this configuration, wires connecting to the pins are determined as having a wire width a, and the module pins T1 to T4 are regarded as being positioned properly.

However, in an actual packaging hierarchy block, there occurs a case where the thickness of wires W1 to W4 which are connected to the module pins T1 to T4, respectively, differ depending on the attributes of connecting nets or wiring layers. Due to this, in a case where there is a wiring rule that the thickness of the wires W3 and W4 which connect to the module pins T3 and T4 be a thickness b which is thicker than the thickness a, in the event that the module pin T4 is placed at the current position, there is a possibility that the wire W4 overlaps the wire W3. Even though the reality is like that, since the module pin placement check determines on overlapping only from grid coordinate pins of the module pins, errors on the packaging hierarchy cannot be detected.

To cope with this, a wiring overlapping check is carried out by obtaining, for the module pints T1 to T4 minimum thicknesses which can satisfy the wiring rule on the connected wires, that is, the thickness a in FIG. 17, while referring to the attributes of the wiring connected to the module pins and the wiring layers where the wiring is placed, and considering the thicknesses so obtained.

According to this configuration, on the contrary to the case with the thick wiring found in the clock system wiring in which errors were unable to be detected until wires were actually laid out, overlapping placement errors of packaging hierarchy block terminals (module pins) can be detected before wires are laid out, thereby making it possible to reduce the work involved in the adjustment of wires which are laid out in designing layouts of cells in an LSI.

(Twenty-first Embodiment)

In an interactive placement/net wiring editor, in verifying layouts of cells or the like during designing such layouts on the editor screen, the entirety of the block of a smaller area is enlarged and displayed in a sequential fashion.

Cells used to be displayed only within the frames thereof except that when they were enlarged for display or the display setting was also on with respect to patterns inside cells. It was difficult to identify whether or not cells are placed when only cell frames are displayed, and in order to know the orientations of placed cells (rotation codes), the aforesaid sampling function and cell find function had to be used.

Figure 18:
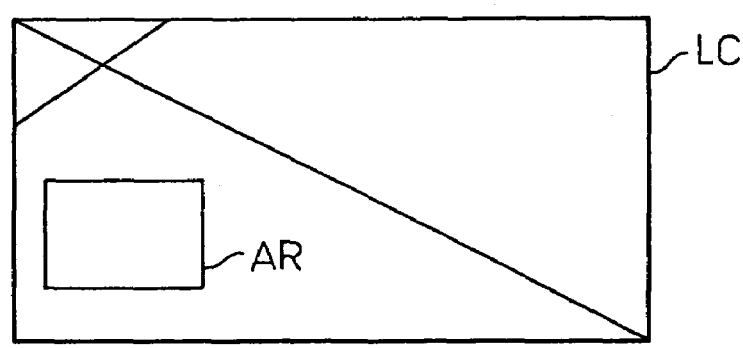
FIG. 18 is a diagram showing a display example when a cell of a gigantic size is displayed on the editor screen.

In addition, when a cell of a large scale exists, as shown in FIG. 18, the cell LC of a large scale is indicated by two inclined lines representing a cell frame, a zero point and a cell rotation code.

However, when smaller areas are enlarged and displayed, in the event that these inclined lines appear within an area AR displayed on the screen, it is understood that part of the cell of a large scale is being displayed. As with the area AR shown in FIG. 18, however, in the event that these inclined lines are located where they cannot be displayed, since nothing is displayed on the screen, it is not possible to identify if the area is an area where the cell is placed or a blank area.

To cope with this, in a cell display of a display size needing no display of a pattern inside a cell, for example, in order to make known of the existence of such a cell of a large scale whichever portion of the cell is enlarged and displayed, the inside of the cell frame is designed to be displayed as a painted-out portion by inclined lines.

Thus, whichever portion of the cell is enlarged and displayed, the identification of the existence of the cell at that particular portion can be eased by designing that the inside of the cell frame is displayed as the painted-out portion by inclined lines.

As has been described heretofore, according to the present invention, since various functions are provided on the placement/net wiring processing system, in the interactive placement/net wiring editor or the general editor, operations for placing or moving cells and adding, deleting or modifying the cells can be carried out easily for data having a number of cells and wiring, and moreover, the operability thereof can be simplified.

What is claimed is:

1. A placement/net wiring processing method using an interactive editor comprising:
   when placement and wiring graphics displayed on an editor screen is modified by operating a placement and wiring processing program, storing modification information of modified graphics which includes objects modified by operating through said placement and wiring processing program and events which are executed by said placement and wiring processing program from booting it up to shutting it down;
   displaying said modification information so stored on a window of said editor screen, and
   when whichever said modification information displayed on said window is designated, redisplaying the placement and wiring graphics associated to said designated modification information on said editor screen.

2. A placement/net wiring processing method using an interactive editor comprising:
   displaying on an editor screen placement and wiring graphics for operation through a placement and wiring processing program, and
   when said displayed placement and wiring graphics is sequentially selected and designated by cursor motion on said editor screen, displaying contents associated with said placement and wiring graphics so selected and designated, on a window of said editor screen,
   wherein, when said placement and wiring graphics is sequentially selected and designated, a user is able to have a choice of displaying only one of the placement and wiring graphics on said window, or displaying the placement and wiring graphics sequentially selected and designated on said window.

3. A placement/net wiring processing method using an interactive editor comprising:
   displaying on an editor screen a plurality of placement and wiring graphics for operation through a placement and wiring processing program;
   storing processing-related information associated with said operated placement and wiring graphics in a storage unit; and
   reading out said processing-related information associated with said operated placement and wiring which is designated by a user, from said storage unit, and displaying a list of said processing-related information so read out on a window of said editor screen by relating said processing-related information to said placement and wiring graphics,
   wherein, when said user selects and designates from said list of said processing-related information displayed on said window, said displayed placement and wiring graphics associated with relevant processing-related information is specified.

4. A placement/net wiring processing method using an interactive editor comprising:
   displaying on an editor screen a plurality of placement and wiring graphics for operation through a placement and wiring processing program;
   affixing a mark to said placement and wiring graphics displayed on said editor screen, said mark being adapted to be displayed on said editor screen when display designation is selected; when said display designation is taken by a user, displaying on said editor screen said plurality of placement and wiring graphics to which said mark are affixed, in the order of marking; and
   when said plurality of placement and wiring graphics are displayed on said editor screen, adjusting a magnification of said plurality of placement and wiring graphics such that sizes of said placement and wiring graphics become similar to each other.

5. A placement/net wiring processing method using an interactive editor comprising:
   displaying on an editor screen a plurality of placement and wiring graphics for operation through a placement and wiring processing program;
   selecting an area containing said displayed placement and wiring graphics on said editor screen, by a user;
   replacing said placement and wiring graphics within said selected area in accordance with a placement designation information which is input by said user,
   wherein said placement designation information designates placement-pitch or placement-distance of said plurality of placement and wiring graphics, or reversing operation for each of said plurality of placement and wiring graphics.

6. A placement/net wiring processing method using an interactive editor comprising:
   displaying on an editor screen a plurality of placement and wiring graphics for operation through a placement and wiring processing program; and
   registering on a catalog placement-related information associated with respective placed placement and wiring graphics on said editor screen; and
   highlighting on said editor screen said placement and wiring graphics in accordance with placement relationship of said registered catalog placement-related information.

7. A placement/net wiring processing method using an interactive editor comprising:

displaying on an editor screen a plurality of placement and wiring graphics placed by operating through a placement and wiring processing program;

displaying connecting relationship information between each of said plurality of placement and wiring graphics; and highlighting said displayed connecting relationship information between placement and wiring graphics selected by a user and placement and wiring graphics not selected by the user, on said editor screen, wherein said connecting relationship information includes a wiring configuration for a Steiner tree-like fashion, a wiring configuration for actually wired portions and portions to be wired, a wiring configuration for an arc shape line in a radiating configuration, a wiring configuration for an arc shape line, or, a wiring configuration for a rubber band.

8. A placement/net wiring processing method using an interactive editor comprising:

displaying in windows on an editor screen a list of names of a plurality of placement and wiring graphics for operation through a placement and wiring processing program; and when one of said names of placement and wiring graphics raised on said list is selected, displaying on said editor screen placement and wiring graphics so selected in accordance with predetermined placing position information which designates a relationship between relevant placement and wiring graphics and other placement and other placement and wiring graphics.

9. A placement/net wiring processing method using an interactive editor comprising:

selecting placement and wiring graphics for operation through a placement and wiring processing program, and displaying said selected placement and wiring graphics on an editor screen;

setting preliminarily a moving direction of said displayed placement and wiring graphics on said editor screen; and when said displayed placement and wiring graphics is designated on said editor screen, said displayed placement and wiring graphics is moved under said moving direction on said editor screen.

10. A placement/net wiring processing method using an interactive editor comprising:

selecting for display on an editor screen placement and wiring graphics for operation through a placement and wiring processing program, and displaying said selected placement and wiring graphics on an editor screen;

when said placement and wiring graphics is designated by a user, selecting a copy command which designates copying of at least partial information within said designated placement and wiring graphics; and when a copying position is designated on said editor screen, copying said at least partial information of placement and wiring graphics at said designated copying position under said copy command.

11. A placement/net wiring processing method using an interactive editor comprising:

selecting a plurality of placement and wiring graphics for operation through a placement and wiring processing program, and displaying said plurality of placement and wiring graphics on an editor screen;

storing placement and wiring rules for a plurality of placement and wiring graphics in a storage unit;

displaying position information associated with respective placement and wiring graphics on said editor screen;

reading out from said storage unit said placement and wiring rule related to the relevant placement and wiring graphics; and checking on positional relationships between said displayed respective graphics of said plurality of placement and wiring graphics, based on said position information, in accordance with said read out placement and wiring rule.

12. A placement/net wiring processing method using an interactive editor comprising:

displaying on an editor screen a plurality of placement and wiring graphics;

when displaying on said editor screen an area containing at least one of said plurality of placement and wiring graphics placed by operating a placement and wiring processing program, displaying said area surrounded with a frame; and when a portion of said area within said frame is enlarged and displayed on said editor screen, displaying a painted-out pattern inside said frame.

13. A placement/net wiring processing method using an interactive editor comprising:

designating modification information stored when placement and wiring graphics displayed on an editor screen is modified by operating a placement and wiring processing program; and redisplaying the placement and wiring graphics associated with said designated modification information on said editor screen when said displayed modification information is designated.

14. A placement/net wiring processing method using an interactive editor comprising:

designating, by a user, processing-related information to be associated with placement and wiring graphics;

displaying said designated processing-related information on a window of an editor screen; and specifying said placement and wiring graphics associated with said designated processing-related information on said editor screen when said user selects said designated processing-related information.

* * * * *

UNITED STATES PATENT AND TRADEMARK OFFICE
CERTIFICATE OF CORRECTION

| | |
|---|---|
| PATENT NO. | : 7,240,317 B2 |
| APPLICATION NO. | : 10/625554 |
| DATED | : July 3, 2007 |
| INVENTOR(S) | : Noriyuki Ito et al. |

It is certified that error appears in the above-identified patent and that said Letters Patent is hereby corrected as shown below:

On the Title Page, Item (56) (Foreign Patent Documents), Line 7, change "1/1999" to --1/1997--.

Signed and Sealed this

Twenty-seventh Day of May, 2008

JON W. DUDAS
*Director of the United States Patent and Trademark Office*